United States Patent
Hirata et al.

(10) Patent No.: US 7,812,380 B2
(45) Date of Patent: Oct. 12, 2010

(54) SOLID-STATE IMAGING DEVICE AND MANUFACTURING METHOD OF THE SAME

(75) Inventors: Tatsuya Hirata, Osaka (JP); Motonari Katsuno, Kyoto (JP)

(73) Assignee: Panasonic Corporation, Osaka (JP)

(*) Notice: Subject to any disclaimer, the term of this patent is extended or adjusted under 35 U.S.C. 154(b) by 9 days.

(21) Appl. No.: 12/239,111

(22) Filed: Sep. 26, 2008

(65) Prior Publication Data
US 2009/0090943 A1 Apr. 9, 2009

(30) Foreign Application Priority Data
Oct. 3, 2007 (JP) ............................. 2007-260297
Aug. 28, 2008 (JP) ............................. 2008-219969

(51) Int. Cl.
*H01L 31/062* (2006.01)
*H01L 31/113* (2006.01)

(52) U.S. Cl. .................. 257/291; 257/292; 257/462; 257/465; 257/E31.062; 438/57

(58) Field of Classification Search .............. 438/57, 438/79; 257/291, E31.073, E21.409
See application file for complete search history.

(56) References Cited

U.S. PATENT DOCUMENTS

| 7,016,089 B2 | 3/2006 | Yoneda et al. | |
|---|---|---|---|
| 2004/0046193 A1* | 3/2004 | Park et al. | 257/292 |
| 2005/0064617 A1* | 3/2005 | Dierickx | 438/48 |
| 2005/0112789 A1* | 5/2005 | Rhodes et al. | 438/22 |
| 2005/0179072 A1* | 8/2005 | Rhodes | 257/291 |
| 2006/0131624 A1 | 6/2006 | Katsuno et al. | |
| 2006/0261386 A1 | 11/2006 | Tanaka et al. | |
| 2006/0284274 A1* | 12/2006 | Lee et al. | 257/431 |
| 2008/0079106 A1 | 4/2008 | Miyagawa et al. | |

FOREIGN PATENT DOCUMENTS

| JP | 2001-185716 | 7/2001 |
|---|---|---|
| JP | 2001-230400 A | 8/2001 |
| JP | 2006-324482 | 11/2006 |

OTHER PUBLICATIONS

English Language Abstract of JP 2001-185716, Jul. 6, 2001.
English Language Abstract of JP 2006-324482, Nov. 30, 2006.
English Language Abstract of 2001-230400 A, Aug. 24, 2001.

* cited by examiner

*Primary Examiner*—Charles D Garber
*Assistant Examiner*—Angel Roman
(74) *Attorney, Agent, or Firm*—Greenblum & Bernstein P.L.C.

(57) ABSTRACT

A solid-state imaging device of the present invention includes: a semiconductor substrate including a first region of a first conductivity type; a signal accumulation region of a second conductivity type formed within the first region; a gate electrode formed above the first region; a drain region of a second conductivity type formed on the first region; an isolation region having insulation properties, which is formed to surround a region where the signal accumulation region, the gate electrode, and the drain region are formed; a first conductivity type dopant doping region formed in contact with a side face and a bottom face of the isolation region, the first conductivity type dopant doping region having a higher dopant concentration than the first region; and a second conductivity type dopant doping region formed in the first region, under an end of the gate electrode in a gate width direction.

11 Claims, 19 Drawing Sheets

Prior Art

Prior Art

Prior Art

101

115

101

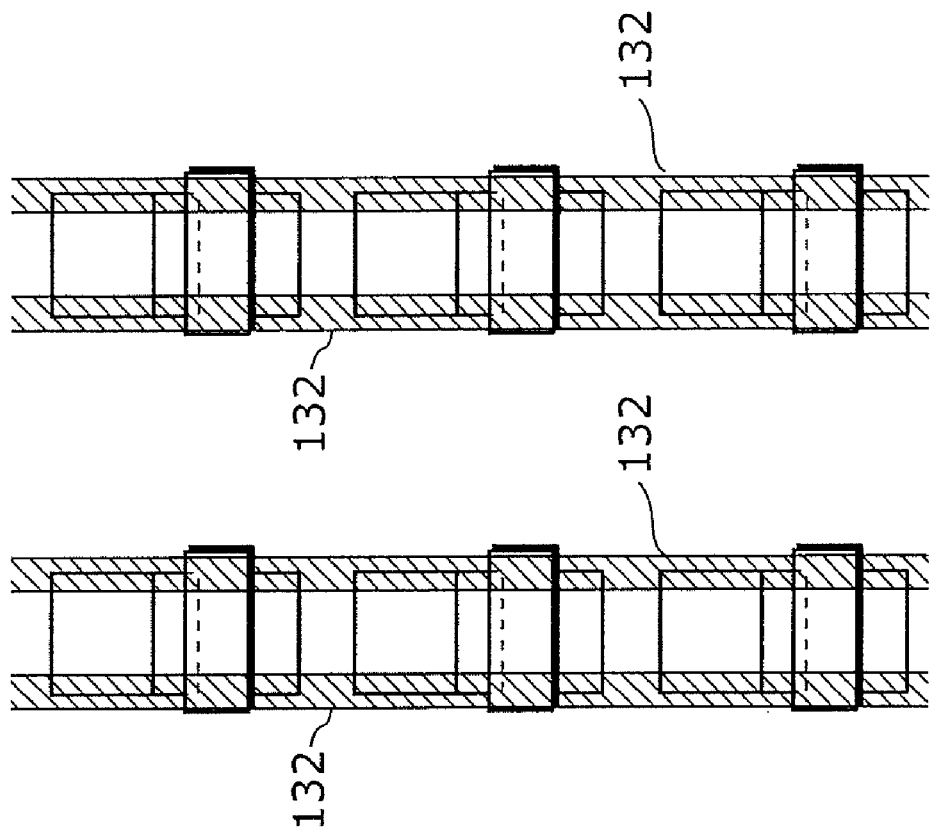
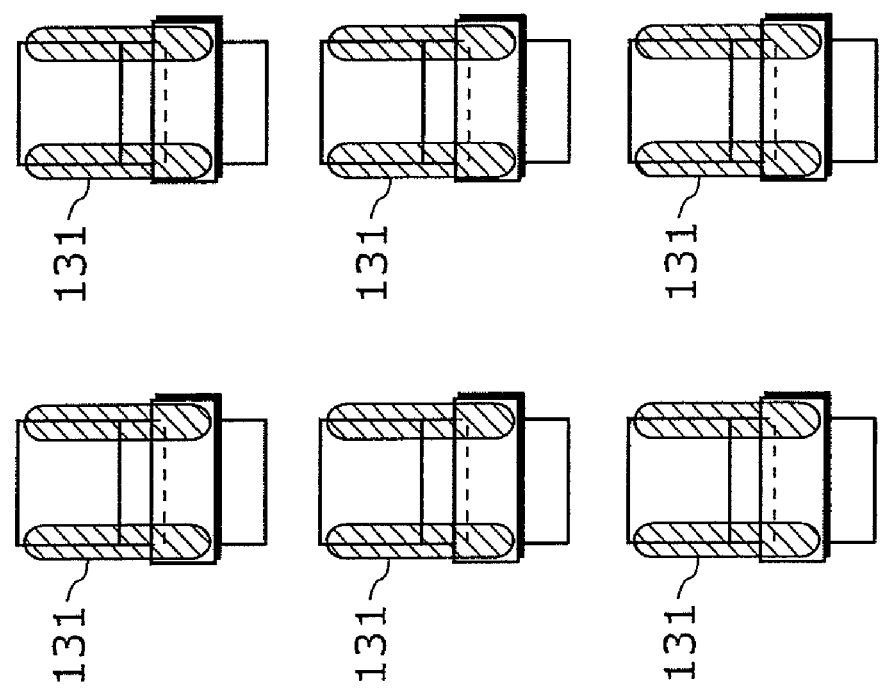
FIG. 21A
FIG. 21B

SOLID-STATE IMAGING DEVICE AND MANUFACTURING METHOD OF THE SAME

BACKGROUND OF THE INVENTION (1) Field of the Invention

The present invention relates to solid-state imaging devices and manufacturing methods of the same and, in particular to a solid-state imaging device that includes a read transistor for reading signal charges accumulated in a signal accumulation region.

(2) Description of the Related Art

In the field of solid-state imaging devices, a large number of techniques have been proposed which relate to a structure of an amplifying solid-state imaging device (metal-oxide semiconductor (MOS) image sensor) (see, for example, Patent Reference 1: Japanese Unexamined Patent Application Publication No. 2006-324482). The amplifying solid-state imaging device has an advantage in that power consumption is lower than that of a charge coupled device (CCD) image sensor. Further, the amplifying solid-state imaging device has an advantage in that a sensor and a peripheral circuit can be easily integrated since the sensor and the peripheral circuit can be manufactured through the same complementary metal oxide semiconductor (CMOS) process.

A conventional solid-state imaging device disclosed in Patent Reference 1 will be described below.

FIG. 1 to FIG. 3 are diagrams which illustrate a structure of the conventional solid-state imaging device disclosed in Patent Reference 1. FIG. 1 is a top plan view which illustrates a structure of a photoelectric conversion unit and a signal read unit for a single pixel. FIG. 2 is a cross sectional view which illustrates a structure of the solid-state imaging device taken along the line Y1-Y2 of FIG. 1. FIG. 3 is a cross sectional view which illustrates a structure of the solid-state imaging device taken along the line X1-X2 of FIG. 1

As illustrated in FIG. 1 to FIG. 3, each of pixels is formed in a P well 101. Each pixel includes: a signal accumulation region (photodiode) 102; a gate oxide film 103; a gate electrode 104; a drain region 105; a surface shield layer 106; an isolation region 107; a defect suppression layer 108; and a capacity enlargement region 112.

The signal accumulation region 102 is an N-type diffusion layer formed in the P well 101. The signal accumulation region 102 is a photoelectric conversion unit that converts light into signal charges and accumulates the converted signal charges.

The gate electrode 104 is formed adjacent to the signal accumulation region 102 above the P well 101 with the gate oxide film 103 being disposed therebetween.

The signal accumulation region 102, the gate electrode 104, and the drain region 105 are included in a single MOS transistor (read transistor). The MOS transistor is included in a signal read unit that reads signal charges accumulated in the signal accumulation region 102.

The surface shield layer 106 is a P-type diffusion layer. The surface shield layer 106 is located above the signal accumulation region 102 and formed on a surface of the P well 101.

The isolation region 107 is a shallow trench isolation (STI) made by etching a semiconductor substrate.

The defect suppression layer 108 is a P-type diffusion layer and formed adjacent to the side and bottom surfaces of the isolation region 107. The defect suppression layer 108 is a layer for suppressing a crystal defect resulting from forming the isolation region 107.

The capacity enlargement region 112 is formed between the defect suppression layer 108 and the signal accumulation region 102. The capacity enlargement region 112 has a higher N-type dopant concentration than the signal accumulation region 102.

According to the above-described structure, the solid-state imaging device disclosed in the Patent Reference 1 is capable of reducing the amount of decrease, resulting from forming the defect suppression layer 108, in an accumulation amount of signal charges in the signal accumulation region 102, by including the capacity enlargement region 112.

With the solid-state imaging device disclosed in Patent Reference 1, however, when a width of the gate electrode 104 is shortened as a result of miniaturization, a width of a channel that transfers a signal (electron) from the signal accumulation region 102 to the drain region 105 is shortened. This poses a problem that an effective channel width becomes significantly shortened due to the defect suppression layer 108.

A detailed description on the above problem will be given with reference to FIG. 4.

FIG. 4A to FIG. 4F are diagrams which illustrate a dopant concentration distribution along the line X3-X4 of FIG. 3. FIG. 4A and FIG. 4B are diagrams which illustrate an N-type dopant concentration distribution. FIG. 4C and FIG. 4D are diagrams which illustrate a P-type dopant concentration distribution. FIG. 4E and FIG. 4F are diagrams which illustrate all dopant concentration distribution including the N-type and the P-type. Further, FIG. 4B, 4D, and FIG. 4F are diagrams which illustrate dopant concentration distribution in the case where a distance between X3 and X4 becomes shorter than that of FIG. 4A, 4C, and FIG. 4E due to a smaller pixel size resulting from miniaturization.

As illustrated in FIG. 4A and FIG. 4B, the N-type dopant concentration is constant regardless of the position along the line X3-X4. On the other hand, as illustrated in FIG. 4C and FIG. 4D, the P-type dopant concentration becomes higher near the defect suppression layer 108 compared to that under the center of the gate electrode 104, and becomes lower as becomes more distant from the defect suppression layer 108. This is attributed to forming the defect suppression layer 108 that has a high P-type dopant concentration.

FIG. 5 is a conceptual diagram which illustrates an ion implantation of the P-type dopant that forms the 108. As illustrated in FIG. 5, the ion implantation is carried out using a resist 109, from a side surface of a trench in which the isolation region 107 is formed. At this time, the ion implantation is carried out so that the P-type dopant concentration peaks around the side surface of the isolation region 107 that includes lots of defects. Accordingly, the P-type dopant concentration peaks around the positions X3 and X4 on the side surface of the isolation region 107.

Thus, as illustrated in FIG. 4E and FIG. 4F, the all dopant concentration including both of the P-type and the N-type becomes higher near the defect suppression layer 108 compared to that under the center of the gate electrode 104. This causes the effective channel width of the read transistor to decrease. In the case where a pixel size is reduced as a result of miniaturization, in particular, the effective channel width significantly decreases since the distance between X3 and X4 becomes shorter, as illustrated in FIG. 4F.

As a result, with the conventional solid-state imaging device, a signal (electron) cannot be completely transferred, in some cases, from the signal accumulation region 102 to the drain region 105. Accordingly, with the conventional solid-state imaging device, the number of remaining electrons; that is, the number of electrons that have not been transferred and left in the signal accumulation region 102 increases.

SUMMARY OF THE INVENTION

Thus, an object of the present invention is to provide a solid-state imaging device capable of suppressing a decrease in the effective channel width.

In order to achieve the object described above, the solid-state imaging device according to the present invention includes: a semiconductor substrate including a first region of a first conductivity type; a signal accumulation region of a second conductivity type which converts light into a signal charge and accumulates the signal charge, the signal accumulation region being formed within the first region; a gate electrode formed above the first region; a drain region of a second conductivity type formed on the first region on a side opposite to the signal accumulation region in relation to the gate electrode; an isolation region having insulation properties, which is formed so as to surround a region where the signal accumulation region, the gate electrode, and the drain region are formed; a first conductivity type dopant doping region formed in contact with a side face and a bottom face of the isolation region, the first conductivity type dopant doping region having a higher dopant concentration than the first region; and a second conductivity type dopant doping region formed in the first region, under an end of the gate electrode in a gate width direction.

With this structure, a channel enlargement region (a second conductivity type dopant doping region) is formed under the end of the gate electrode in the gate width direction, which has a higher dopant concentration of a second conductivity type than the central area under the gate electrode. This enable the solid-state imaging device according to the present invention to suppress the decrease in the effective channel width of the read transistor caused by forming the defect suppression layer (a first conductivity type dopant doping region). Accordingly, the solid-state imaging device according to the present invention can reduce the increase in the number of remaining electrons resulting from miniaturization.

Further, the first conductivity type dopant doping region may be a defect suppression region and the second conductivity type dopant doping region may be a channel enlargement region.

Further, the second conductivity type dopant doping region may have a first conductivity type dopant concentration which is higher than a second conductivity type dopant concentration of the second conductivity type dopant doping region.

Further, at least a portion of the first conductivity type dopant doping region may be formed under the gate electrode, and the second conductivity type dopant doping region may be in contact with the first conductivity type dopant doping region.

With this structure, it is possible to increase the dopant concentration of the second conductivity type in a region that is adjacent to the defect suppression layer formed under the gate electrode. Accordingly, the solid-state imaging device according to the present invention can suppress the decrease in the effective channel width resulting form forming the defect suppression layer.

Further, the second conductivity type dopant doping region may be formed on the first region, under both ends of the gate electrode in a gate width direction.

With this structure, a region having a high dopant concentration of the second conductivity type is formed under the both ends of the gate electrode in the gate width direction, thereby further suppressing the decrease in the effective channel width.

Further, the solid-state imaging device may further comprise a capacity enlargement region of the second conductivity type formed in contact with a side face of the signal accumulation region in the gate width direction, the capacity enlargement region having a higher second conductivity type dopant concentration than the signal accumulation region.

With this structure, it is possible to reduce the amount of decrease, resulting from forming the defect suppression layer, in an accumulation amount of signal charges.

Further, the solid-state imaging device may further comprise a surface shield layer of the first conductivity type formed on the first region above the signal accumulation region, the surface shield layer having a higher first conductivity type dopant concentration than the first region.

With this structure, it is possible to suppress occurrence of a dark current by forming, above the signal accumulation region, the surface shield layer having a conductivity type opposite from that of the signal accumulation region.

Further, the method of manufacturing the solid-state imaging device according to the present invention includes: forming a first region of a first conductivity type on a semiconductor substrate; forming a signal accumulation region of a second conductivity type within the first region, the signal accumulation region converting light into a signal charge and accumulating the signal charge; forming a gate electrode above the first region; forming a drain region of a second conductivity type on the first region on a side opposite to the signal accumulation region in relation to the gate electrode; forming an isolation region having insulation properties so as to surround a region where the signal accumulation region, the gate electrode, and the drain region are formed; forming a first conductivity type dopant doping region in contact with a side face and a bottom face of the isolation region, the first conductivity type dopant doping region having a higher dopant concentration than the first region; and forming a second conductivity type dopant doping region on the first region, under an end of the gate electrode in a gate width direction.

With this, a channel enlargement region (a second conductivity type dopant doping region) is formed under the end of the gate electrode in the gate width direction, which has a higher dopant concentration of a second conductivity type than the central area under the gate electrode.

With this, the method of manufacturing the solid-state imaging device according to the present invention can manufacture the solid-state imaging device capable of reducing an increase in the number of remaining electrons resulting from miniaturization, by suppressing the decrease in the effective channel width of the read transistor caused by forming the defect suppression layer (a first conductivity type dopant doping region).

Further, the method of manufacturing the solid-state imaging device may further comprise forming a surface shield layer of the first conductivity type on the first region above the signal accumulation region, the surface shield layer having a higher first conductivity type dopant concentration than the first region.

Further, the method of manufacturing the solid-state imaging device may further comprise forming a capacity enlargement region of the second conductivity type in contact with a side face of the signal accumulation region in the gate width direction by using an ion implantation mask that is used for forming the second conductivity type dopant doping region, the capacity enlargement region having a higher second conductivity type dopant concentration than the signal accumulation region.

Further, the signal accumulation region, the gate electrode, the drain region, the second conductivity type dopant doping region, and the capacity enlargement region may be formed in each of pixels, and the capacity enlargement region and the second conductivity type dopant doping region may be formed by using the ion implantation mask having an implantation space pattern that continues over at least two of the pixels.

With this, the channel enlargement region and the capacity enlargement region can be formed stably since an implantation space pattern in plural pixels does not become a microscopic pattern. With this, the method of manufacturing the solid-state imaging device according to the present invention can reduce unevenness in characteristics, thereby improving fabrication yield.

As described above, the present invention can provide a solid-state imaging device capable of suppressing the decrease in the effective channel width.

FURTHER INFORMATION ABOUT TECHNICAL BACKGROUND TO THIS APPLICATION

The disclosures of Japanese Patent Application No. 2007-260297 filed on Oct. 3, 2007 and No. 2008-219969 filed on Aug. 28, 2008 each including specification, drawings and claims are incorporated herein by reference in their entirety.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the Drawings:

FIG. 21A is a top plan view which illustrates a structure of a resist pattern of the solid-state imaging device according to the second embodiment of the present invention;

FIG. 21B is a top plan view which illustrates a structure of a resist pattern of the solid-state imaging device according to the second embodiment of the present invention;

DESCRIPTION OF THE PREFERRED EMBODIMENTS

Embodiments according to a solid-state imaging device according to the present invention will be described in detail below with reference to the drawings.

First Embodiment

A solid-state imaging device according to a first embodiment of the present invention includes a region which is formed under a gate electrode 104 of a read transistor at ends in a gate width direction (a channel width direction), and which has a high concentration of an N-type dopant. The above structure enables the solid-state imaging device according to the first embodiment of the present invention to suppress a decrease in the effective channel width resulting from a formation of a defect suppression layer 108, thereby allowing reduction of increase in the number of remaining electrons caused by miniaturization.

The solid-state imaging device according to the first embodiment of the present invention is a MOS image sensor including plural pixels arranged in a plane. Each of the pixels includes a photoelectric conversion unit and a signal read unit.

Figure 1:
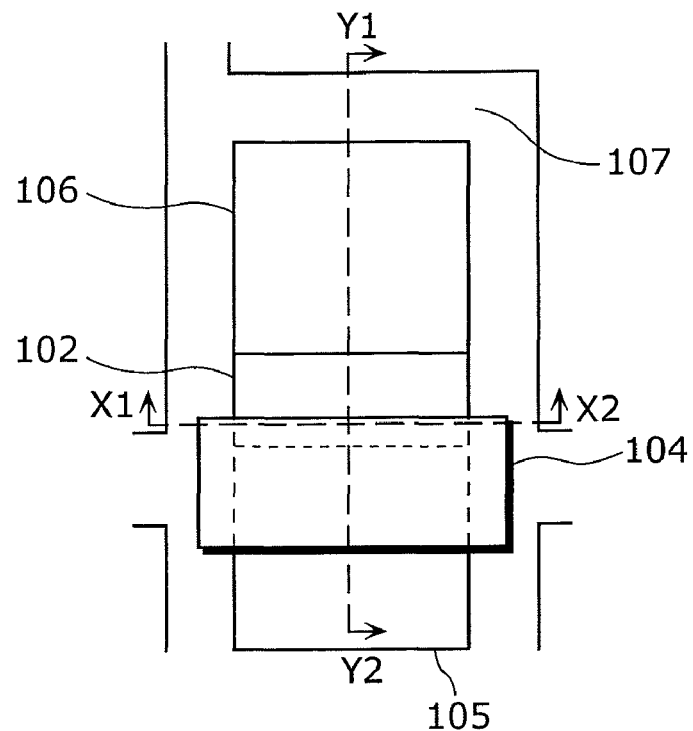
FIG. 1 is a top plan view which illustrates a structure of a conventional solid-state imaging device.
Figure 6:
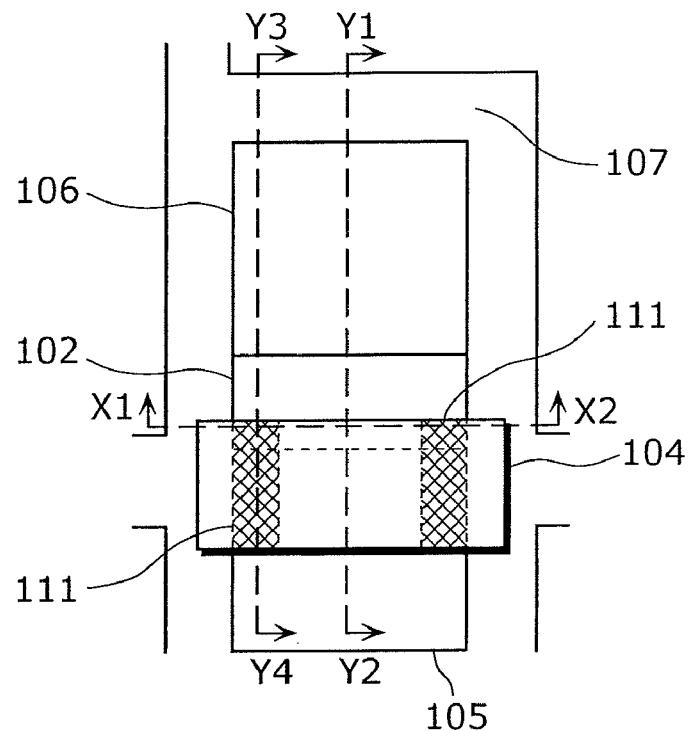
FIG. 6 is a top plan view which illustrates a structure of a solid-state imaging device according to a first embodiment of the present invention.
Figure 7:
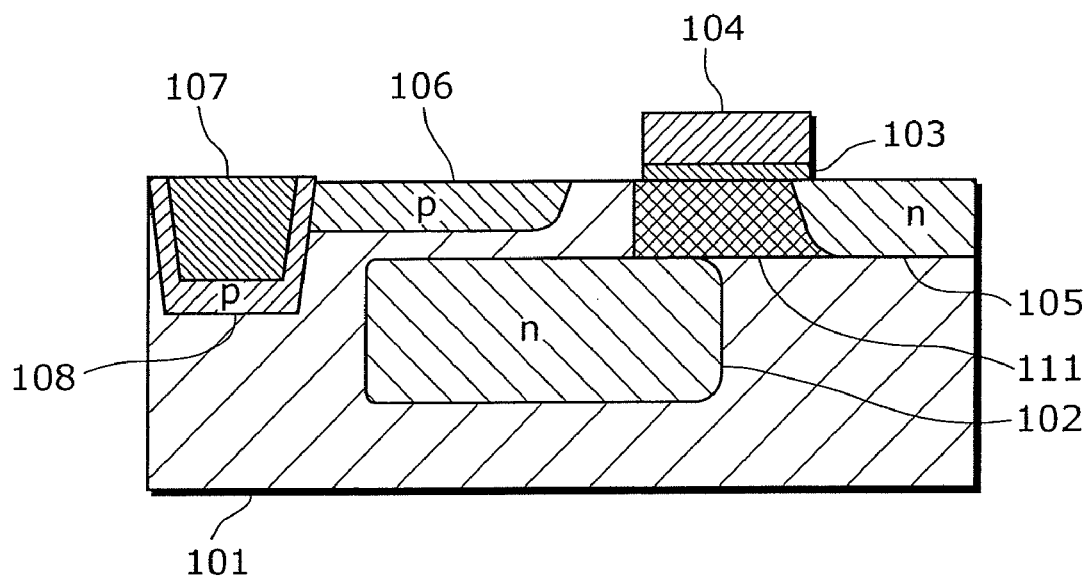
FIG. 7 is a cross sectional view, taken along the line Y3-Y4 of FIG. 6, which illustrates a structure of the solid-state imaging device according to the first embodiment of the present invention.
Figure 8:
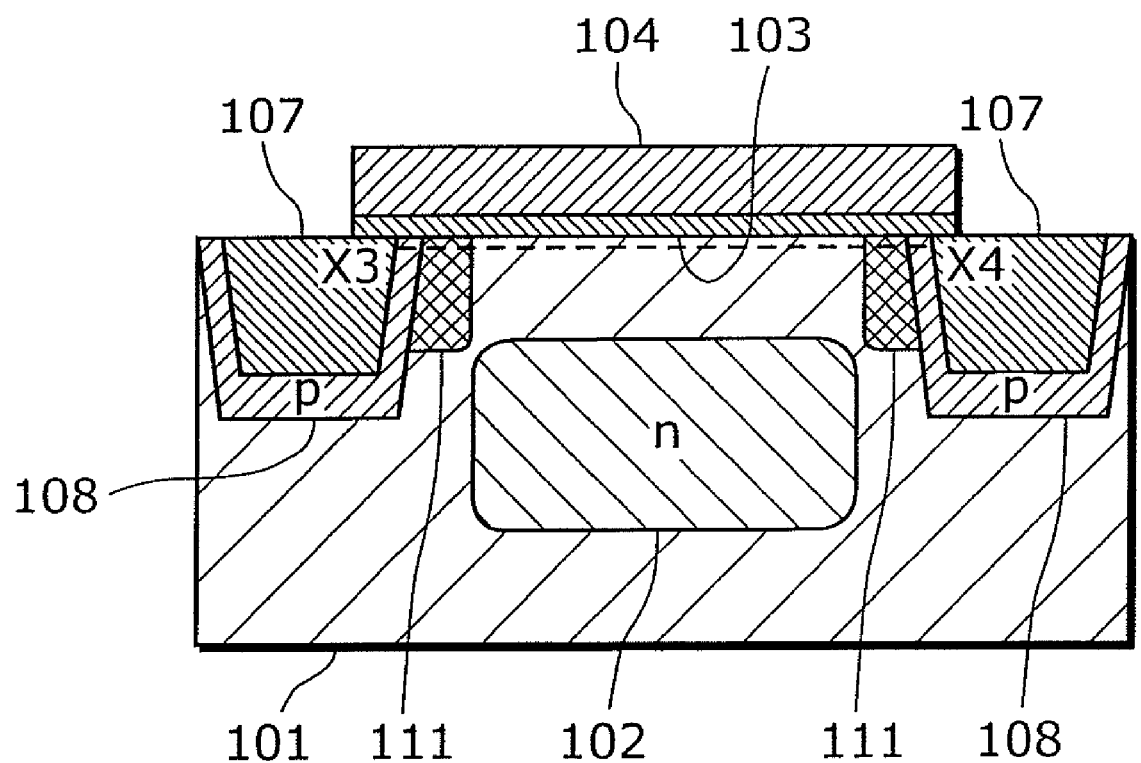
FIG. 8 is a cross sectional view, taken along the line X1-X2 of FIG. 6, which illustrates a structure of the solid-state imaging device according to the first embodiment of the present invention.

FIG. 6 to FIG. 8 are diagrams which illustrate a structure of a single pixel of the solid-state imaging device according to the first embodiment of the present invention. FIG. 6 is a top plan view which illustrates a structure of a single pixel of the solid-state imaging device according to the first embodiment of the present invention. FIG. 7 is a cross sectional view, taken along the line Y3-Y4 of FIG. 6, which illustrates a structure of the solid-state imaging device. FIG. 8 is a cross sectional view, taken along the line X1 to X2 of FIG. 6, which illustrates a structure of the solid-state imaging device. It is to be noted that the same numerals are assigned to the same elements as in FIG. 1 to FIG. 3.

As illustrated in FIG. 6 to FIG. 8, each pixel is formed in a P well 101 formed on a semiconductor substrate (not illustrated). Each pixel includes: a signal accumulation region (photodiode) 102; a gate oxide film 103; a gate electrode 104; a drain region 105; a surface shield layer 106; an isolation region 107; a defect suppression layer 108; and a read channel enlargement region 111.

It is to be noted that the cross sectional view, taken along the line Y1 to Y2 of FIG. 6, has such a structure that only the read channel enlargement region 111 is removed from the structure illustrated by FIG. 7.

The P well 101 is formed on the semiconductor substrate and has a P-type dopant concentration that ranges from 1 E12/cm$^3$ to 1 E16/cm$^3$, approximately.

The signal accumulation region 102 is an N-type diffusion layer formed in the P well 101 and has an N-type dopant concentration that ranges from 2 E16/cm$^3$ to 2E17/cm$^3$, approximately. The signal accumulation region 102 is a photoelectric conversion unit that converts light to signal charges. The signal accumulation region 102 accumulates signal charges which have been converted.

The gate oxide film 103 is formed above the P well 101. The gate electrode 104 is formed in contact with the signal accumulation region 102 above the P well 101 with the gate oxide film 103 being positioned in between.

The drain region 105 is an N-type diffusion layer which has an N-type dopant concentration that ranges from 1 E17/cm$^3$ to 1 E19/cm$^3$, approximately. The drain region 105 is formed on a surface of the P well 101 on the opposite side of the signal accumulation region 102 in the Y direction (in the lengthwise direction of FIG. 6) seen from the gate electrode 104.

The signal accumulation region 102, the gate electrode 104, and the drain region 105 are included in a single MOS transistor (read transistor). The MOS transistor is included in a signal read unit that reads signal charges accumulated in the signal accumulation region 102.

The surface shield layer 106 is a P-type diffusion layer and has a P-type dopant concentration that ranges from 1 E19/cm$^3$ to 1 E21/cm$^3$, approximately. The surface shield layer 106 is formed on the surface of the P well 101 and positioned above the signal accumulation region 102. The surface shield layer 106 has a higher P-type dopant concentration than that of the P well (a P-type dopant concentration ranges from 1 E12/cm$^3$ to 1 E16/cm$^3$, approximately). The surface shield layer 106 is a layer having an opposite conductivity type from that of the signal accumulation region 102, which is for suppressing occurrence of a dark current.

The isolation region 107 is made of an insulation material and electrically isolates each of the pixels. More specifically, the isolation region 107 is a STI made by etching a semiconductor substrate. The isolation region 107 is formed so as to surround a region in which the signal accumulation region 102, the gate electrode 104, and the drain region 105 are formed. In other words, the isolation region 107 is formed so as to surround the signal accumulation region 102 and the read transistor.

The defect suppression layer 108 is a P-type diffusion layer (a P-type dopant doping region) having a P-type dopant concentration that ranges from 1 E17/cm$^3$ to 1 E18/cm$^3$, approximately, and formed so as to be in contact with side faces and a bottom face of the isolation region 107. The defect suppression layer 108 has a higher P-type dopant concentration than that of the P well 101 (a P-type dopant concentration ranges from 1 E12/cm$^3$ to 1 E16/cm$^3$, approximately). The defect suppression layer 108 is a layer for suppressing a crystal defect resulting from forming the isolation region 107.

Further, portions of the isolation region 107 and defect suppression layer 108 on a side close to the gate electrode 104 are formed under the gate electrode 104.

The read channel enlargement region 111 is formed in the P well 101 under the both ends of the gate electrode 104 along the gate width direction (the X direction). The read channel enlargement region 111 is formed so as to be in contact with the defect suppression layer 108 under the gate electrode 104 along the gate width direction.

The read channel enlargement region 111 is an N-type dopant region (an N-type dopant doping region) formed by ion implantation of the N-type dopant into the P well 101 and has an N-type dopant concentration that ranges from 1 E15/cm$^3$ to 1 E16/cm$^3$, approximately. It is to be noted that the region formed by ion implantation of the N-type dopant (doping of an N-type dopant) is referred here to as the N-type dopant region (an N-type dopant doping region).

Further, the N-type dopant concentration of the read channel enlargement region 111 is lower than the P-type dopant concentration of the read channel enlargement region, so that the read channel enlargement region 111 physically has a P-type polarity and functions as a P-type region.

Further, the read channel enlargement region 111 has a higher N-type dopant concentration than that of a region under the center of the gate electrode 104 other than the read channel enlargement region 111 in the P well 101 (the N-type dopant concentration ranges from 1 E14/cm$^3$ to 1 E15/cm$^3$, approximately). The read channel enlargement region 111 has the N-type dopant concentration at least twice higher than that of the region under the gate electrode 104 where the read channel enlargement region 111 is not formed. The read channel enlargement region 111 is the dopant region different form the signal accumulation region 102 and the defect suppression layer 108.

It is to be noted that although the read channel enlargement region 111 is only formed under the gate electrode 104 in a gate length direction (Y direction) that is a transfer direction of the read transistor as illustrated in FIG. 6 and FIG. 7, the read channel enlargement region 111 may be formed other region than that under the gate electrode 104 above the signal accumulation region 102.

Figure 3:
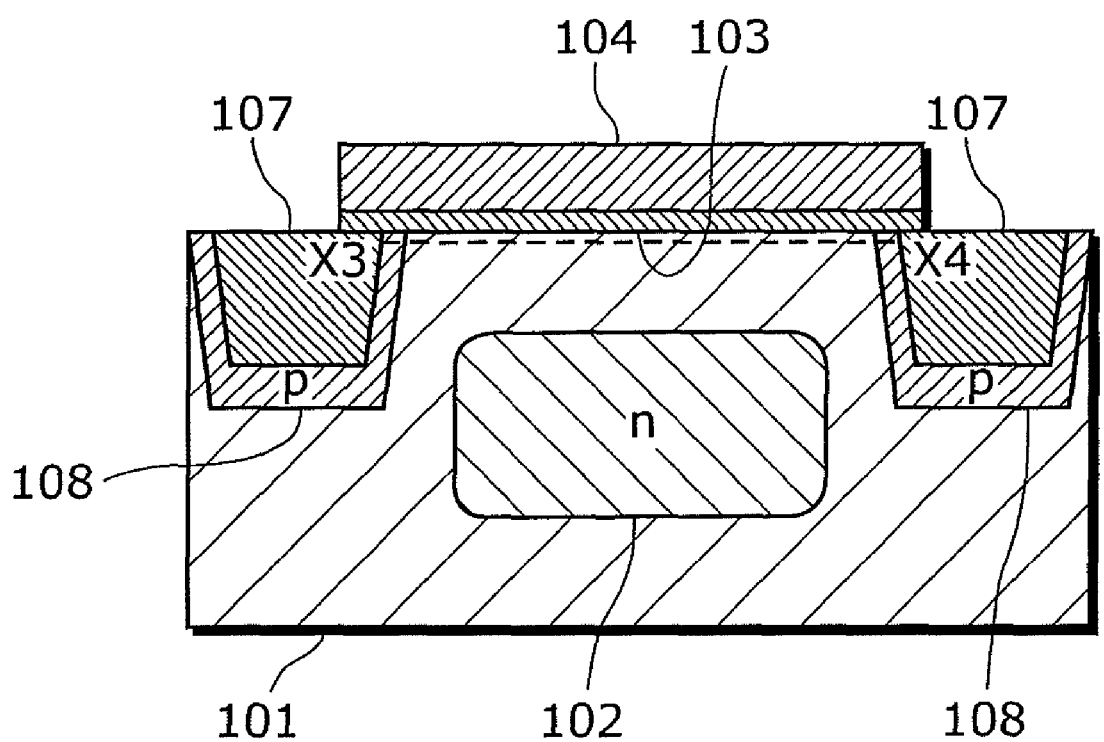
FIG. 3 is a cross sectional view, taken along the line X1-X2 of FIG. 1, which illustrates a structure of the conventional solid-state imaging device.
Figure 4A:
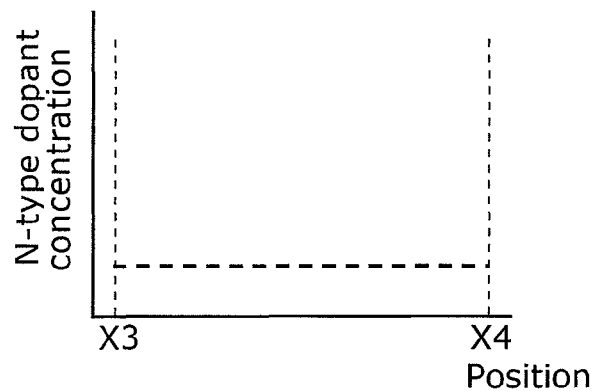
FIG. 4A is a diagram which illustrates an N-type dopant concentration distribution along the line X3-X4 of FIG. 3 under the gate electrode of the conventional solid-state imaging device.
Figure 4B:
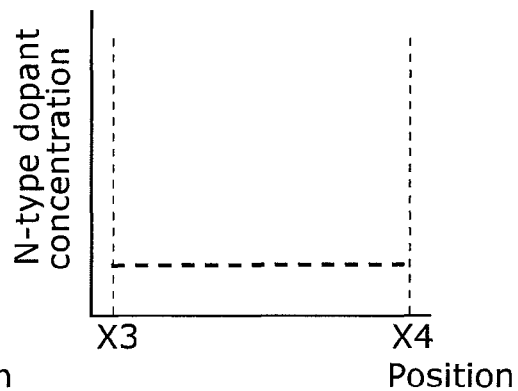
FIG. 4B is a diagram which illustrates an N-type dopant concentration distribution along the line X3-X4 of FIG. 3 under the gate electrode of the conventional solid-state imaging device.
Figure 4C:
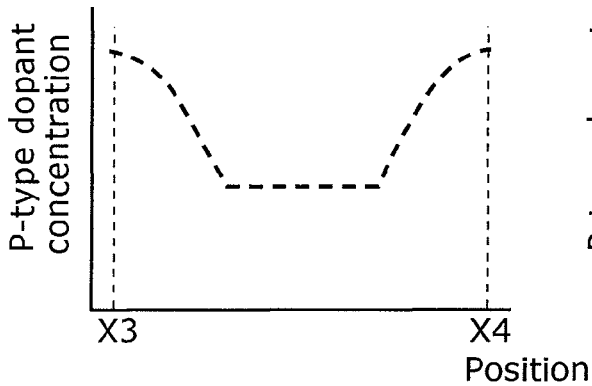
FIG. 4C is a diagram which illustrates a P-type dopant concentration distribution along the line X3-X4 of FIG. 3 under the gate electrode of the conventional solid-state imaging device.
Figure 4D:
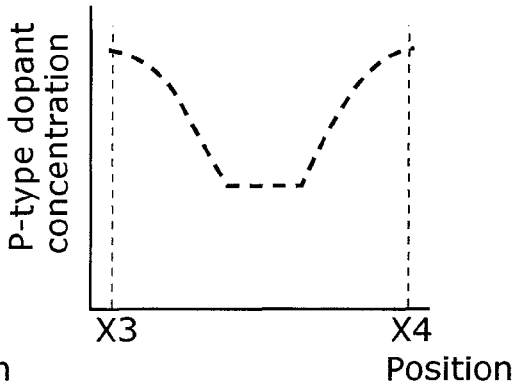
FIG. 4D is a diagram which illustrates a P-type dopant concentration distribution along the line X3-X4 of FIG. 3 under the gate electrode of the conventional solid-state imaging device.
Figure 4E:
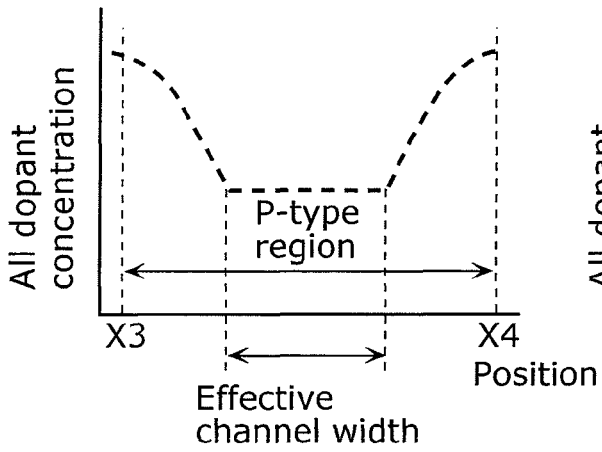
FIG. 4E is a diagram which illustrates an all dopant concentration distribution along the line X3-X4 of FIG. 3 under the gate electrode of the conventional solid-state imaging device.
Figure 4F:
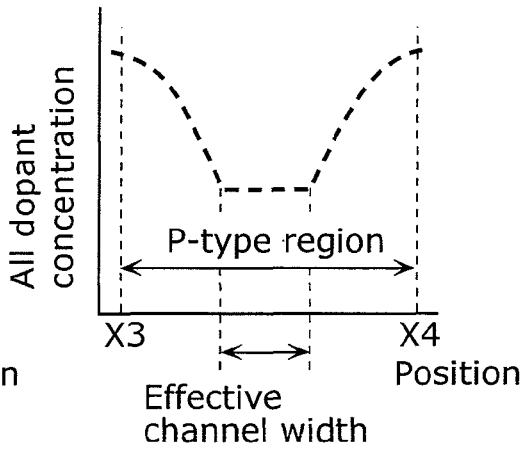
FIG. 4F is a diagram which illustrates an all dopant concentration distribution along the line X3-X4 of FIG. 3 under the gate electrode of the conventional solid-state imaging device.
Figure 5:
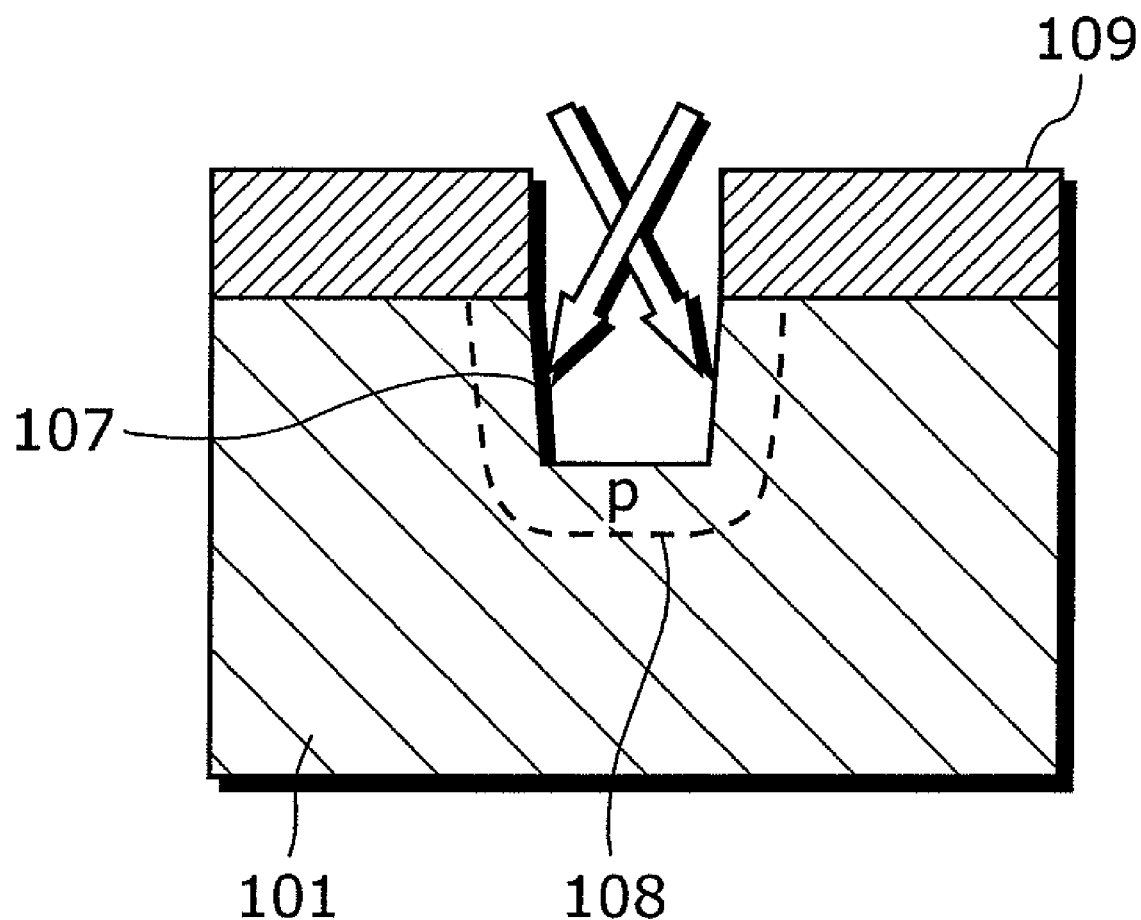
FIG. 5 is a diagram which illustrates a frame format of an ion implantation process for forming the defect suppression layer according to the conventional solid-state imaging device.
Figure 9A:
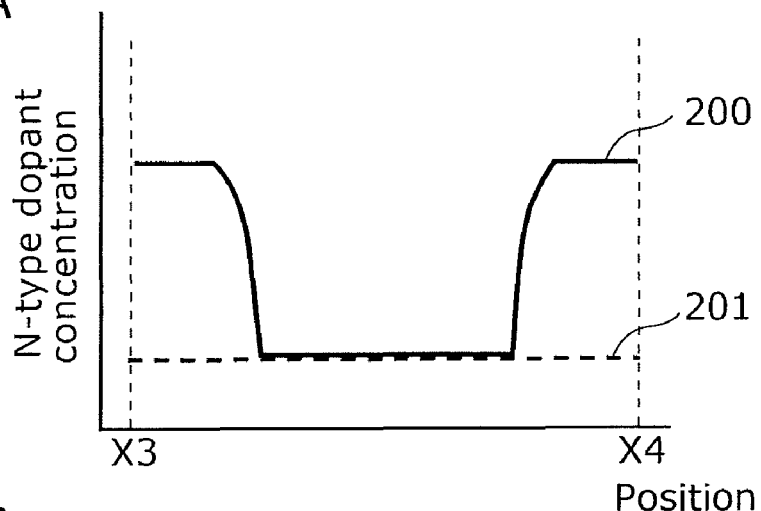
FIG. 9A is a diagram which illustrates an N-type dopant concentration distribution along the line X3-X4 of FIG. 8 under the gate electrode of the solid-state imaging device according to the first embodiment of the present invention.
Figure 9B:
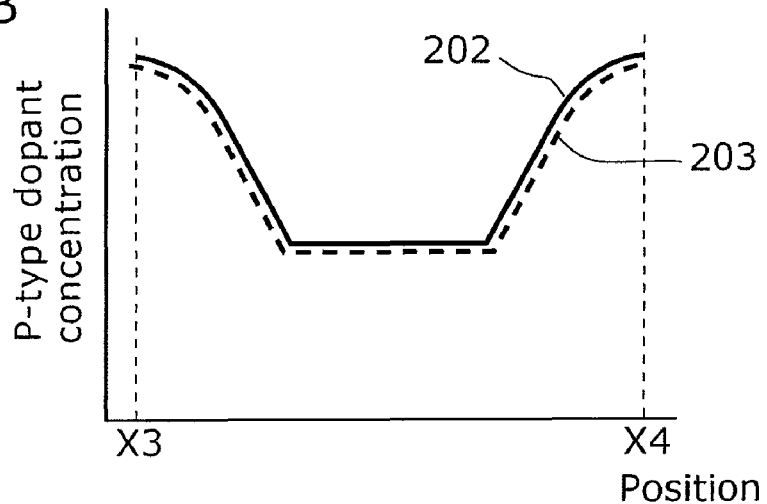
FIG. 9B is a diagram which illustrates a P-type dopant concentration distribution along the line X3-X4 of FIG. 8 under the gate electrode of the solid-state imaging device according to the first embodiment of the present invention.
Figure 9C:
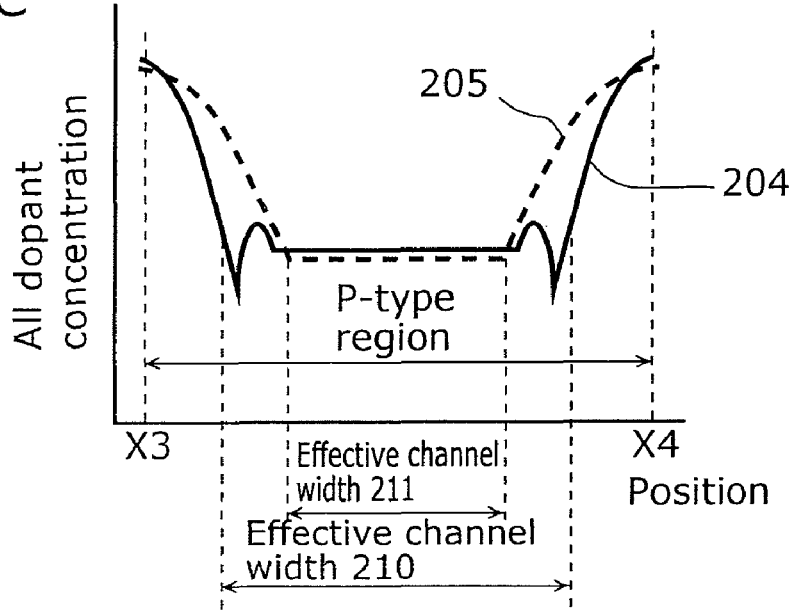
FIG. 9C is a diagram which illustrates an all dopant concentration distribution along the line X3-X4 of FIG. 8 under the gate electrode of the solid-state imaging device according to the first embodiment of the present invention.

FIG. 9A to FIG. 9C are diagrams which illustrate a dopant concentration distribution on the position along the line X3-X4 of FIG. 3 illustrating the conventional solid-state imaging device and FIG. 8 illustrating the solid-state imaging device according to the first embodiment of the present invention. FIG. 9A illustrates an N-type dopant concentration distribution, FIG. 9B illustrates a P-type dopant concentration distribution, and FIG. 9C illustrates an all dopant concentration distribution in which the N-type and the P-type are combined.

As illustrated in FIG. 9A, an N-type dopant concentration 201 of the conventional solid-state imaging device is constant regardless of the position along the line X3-X4. However, an N-type dopant concentration 200 of the solid-state imaging device according to the present embodiment shows that the N-type dopant concentration in a region close to the isolation region 107 is higher than the N-type dopant concentration under the center of the gate electrode 104.

Further, as illustrated in FIG. 9B, a P-type dopant concentration 202 of the conventional solid-state imaging device and a P-type dopant concentration 203 of the solid-state imaging device of the present embodiment are similar. The P-type dopant concentration 202 and the P-type dopant concentration 203 on a position along the line X3-X4 are high close to the defect suppression layer 108 compared to that under the center of the gate electrode 104, and becomes lower as becomes more distant from the defect suppression layer 108 This is attributed to forming the defect suppression layer 108 having a high P-type dopant concentration.

As illustrated in FIG. 9C, an all dopant concentration 204 of the solid-state imaging device of the present embodiment shows that the P-type region under the gate electrode 104, especially the region that has the high P-type dopant concentration decreases as compared to an all dopant concentration 205 in which the N-type and the P-type of the conventional solid-state imaging device are combined. As a result, an effective channel width 210 of the solid-state imaging device of the present embodiment becomes longer than an effective channel width 211 of the conventional solid-state imaging device. It is to be noted that, the effective channel width is a width of the region that functions as the P-type region as physically having a P-type polarity and has an all dopant concentration that is equal to or lower than that under the center of the gate electrode 104. The effective channel width is, for example, a width of a region that has a dopant concentration that is equal to or lower than 9 E16/cm$^3$.

As described above, the solid-state imaging device according to the first embodiment of the present invention is capable of suppressing a decrease in the effective channel width of the read transistor resulting from forming the defect suppression layer 108, thereby allowing reduction of increase in the number of remaining electrons. The present invention is especially effective in the case where a reduction in the effective channel width due to the defect suppression layer 108 is significant. For example, in the case where a cell area of a single pixel is approximately 2×2 µm and a length of the line X3-X4 is approximately 1 µm, whereas the effective channel width 211 of the conventional solid-state imaging device is approximately 0.2 µm, the effective channel width 210 of the solid-state imaging device according to the present embodiment is approximately 0.6 µm, so that the effective channel width 210 can be made longer than the effective channel width 211.

Next, a method for manufacturing the solid-state imaging device according to the first embodiment of the present invention will be described.

FIG. 10 to FIG. 15 are diagrams for explaining a manufacturing method of the solid-state imaging device according to the first embodiment of the present invention.

Figure 10:
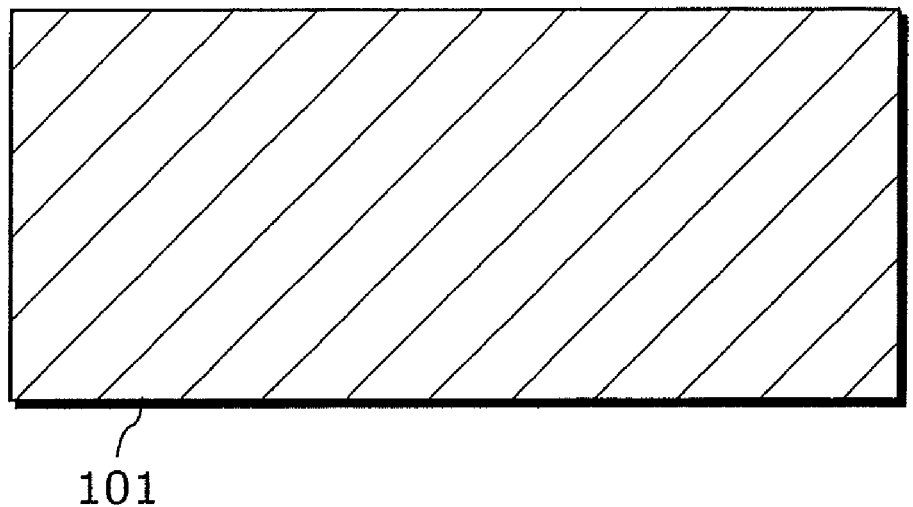
FIG. 10 is a diagram for explaining a manufacturing method of the solid-state imaging device according to the first embodiment of the present invention.
Figure 11:
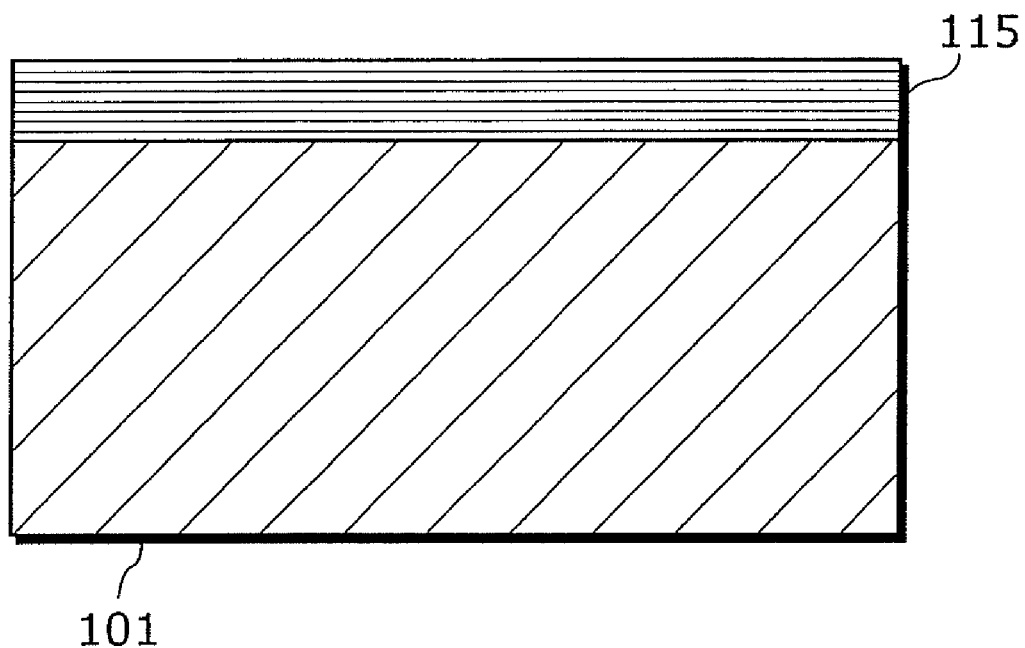
FIG. 11 is a diagram for explaining a manufacturing method of the solid-state imaging device according to the first embodiment of the present invention.
Figure 12:
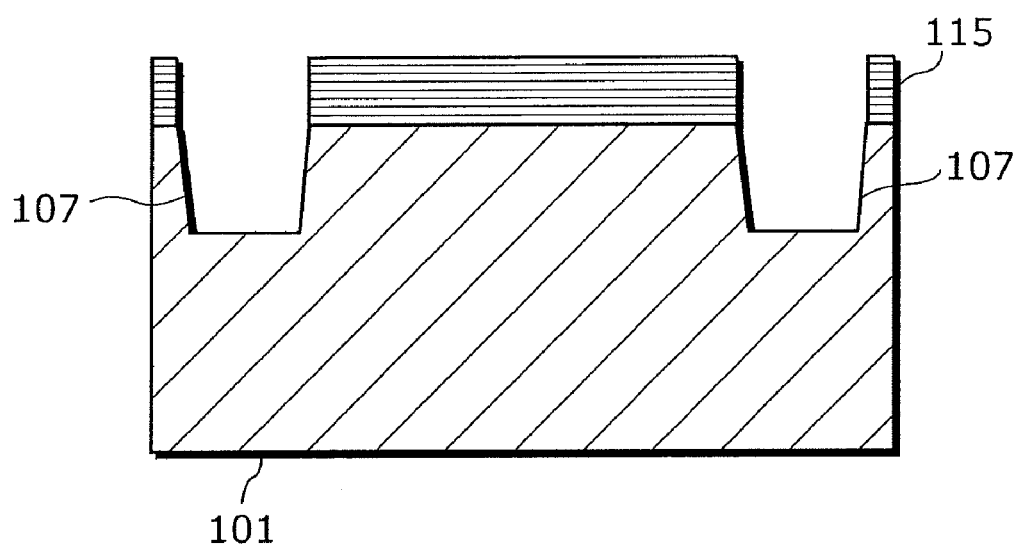
FIG. 12 is a diagram for explaining a manufacturing method of the solid-state imaging device according to the first embodiment of the present invention.
Figure 13:
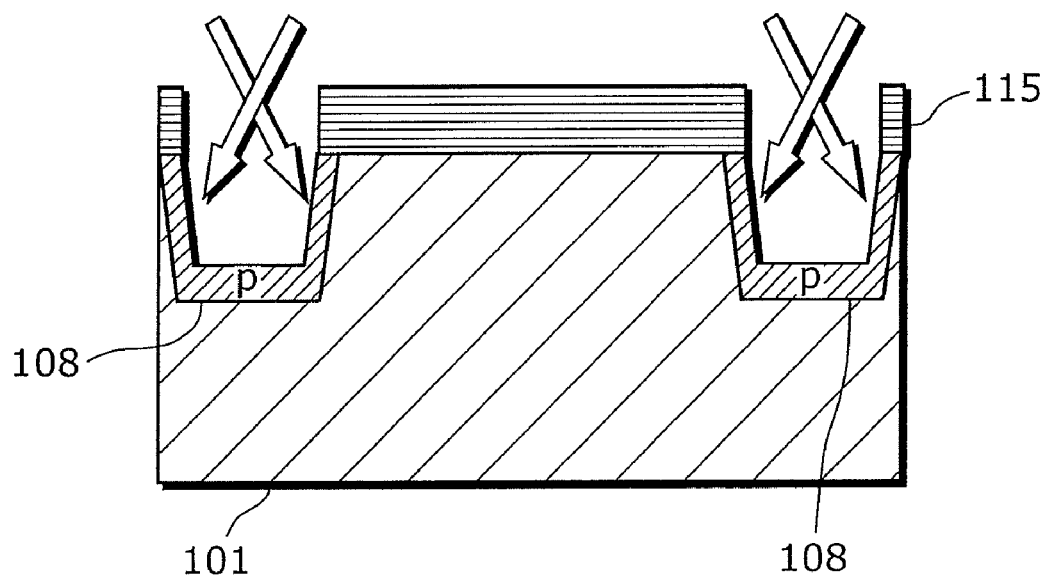
FIG. 13 is a diagram for explaining a manufacturing method of the solid-state imaging device according to the first embodiment of the present invention.

First, as illustrated in FIG. 10, the P well 101 is formed on the semiconductor substrate. Next, as illustrated in FIG. 11, a nitride film 115 is deposited on the P well 101. Next, as illustrated in FIG. 12, the nitride film 115 is patterned and the patterned nitride film 115 is used as a mask for etching so that a trench for forming the isolation region 107 is defined. Next, as illustrated in FIG. 13, the defect suppression layer 108 is formed on the bottom and side surfaces of the trench thorough ion implantation of the P-type dopant using the nitride film 115 as a hard mask. Next, the isolation region 107 is formed by filling the trench with an insulation material (for example, oxide silicon and the like).

Figure 14:
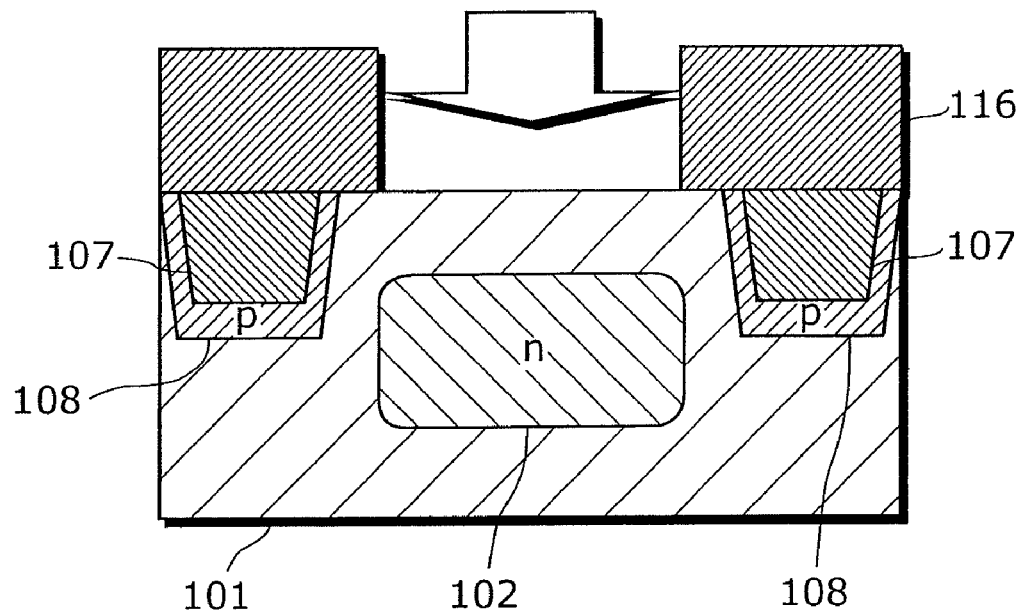
FIG. 14 is a diagram for explaining a manufacturing method of the solid-state imaging device according to the first embodiment of the present invention.
Figure 15:
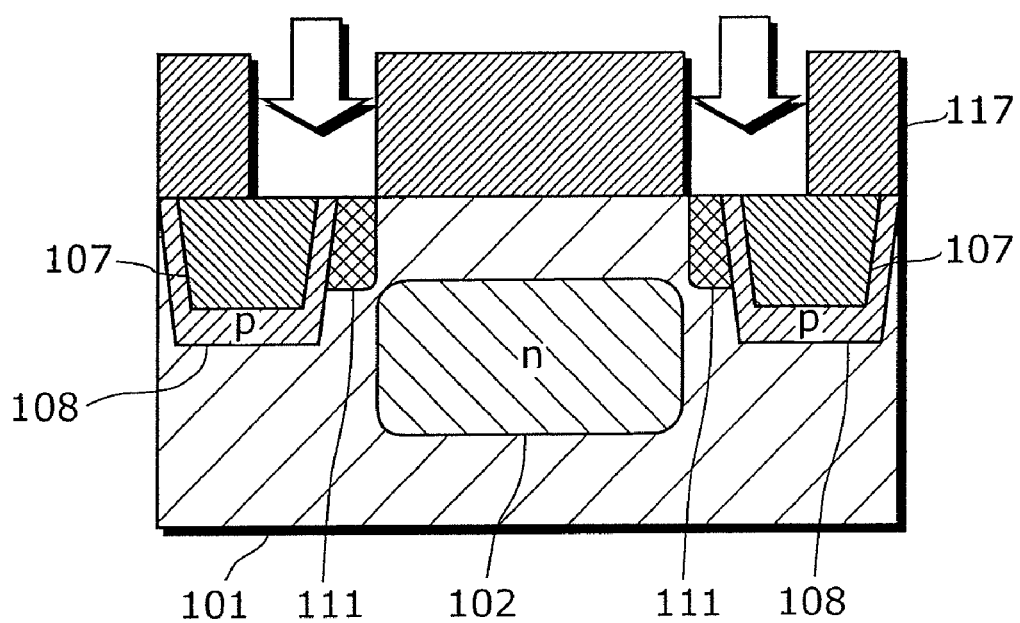
FIG. 15 is a diagram for explaining a manufacturing method of the solid-state imaging device according to the first embodiment of the present invention.

Next, as illustrated in FIG. 14, the signal accumulation region 102 is formed through ion implantation of the N-type dopant using a resist 116 after removing the nitride film 115. Next, as illustrated in FIG. 15, the read channel enlargement region 111 is formed through ion implantation of the N-type dopant using a resist 117.

Next, the gate oxide film 103 and the gate oxide film 104 are sequentially formed. Next, the surface shield layer 106 is formed through ion implantation of the P-type dopant using a resist, and the drain region 105 is formed through ion implantation of the N-type dopant using a resist, sequentially.

With the above-described processes, the solid-state imaging device illustrated in FIG. 6 to FIG. 8 is formed.

Embodiment 2

A solid-state imaging device according to a second embodiment of the present invention has the same structure as the solid-state imaging device according to the first embodiment and further includes a capacity enlargement region 112 that is formed on the ends of the signal accumulation region 102 along the X direction. This enables the solid-state imaging device according to the second embodiment of the present invention to recover an accumulation amount of signal charges of the signal accumulation region 102 that has been decreased due to formation of the defect suppression layer 108, thereby suppressing deterioration of saturation characteristic and sensitivity characteristic resulting from decrease in the accumulation amount of signal charges.

Figure 16:
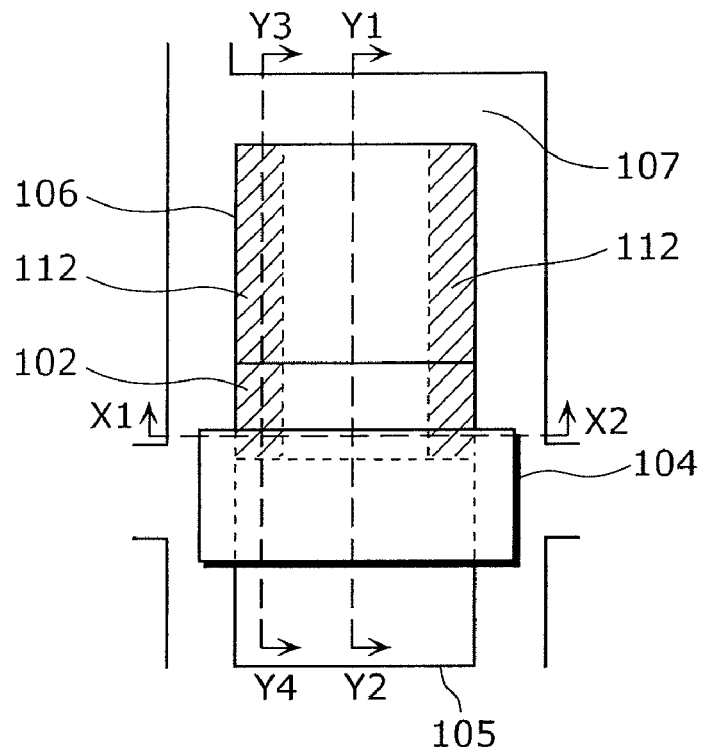
FIG. 16 is a top plan view which illustrates a structure of a solid-state imaging device according to a second embodiment of the present invention.
Figure 17:
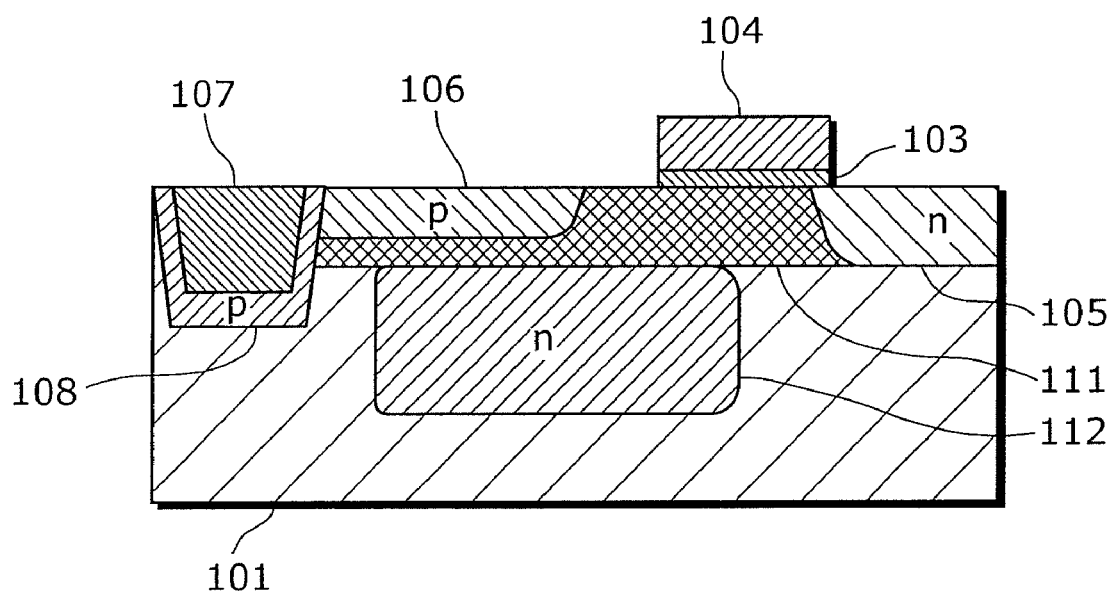
FIG. 17 is a cross sectional view, taken along the line Y3-Y4 of FIG. 16, which illustrates a structure of the solid-state imaging device according to the second embodiment of the present invention.
Figure 18:
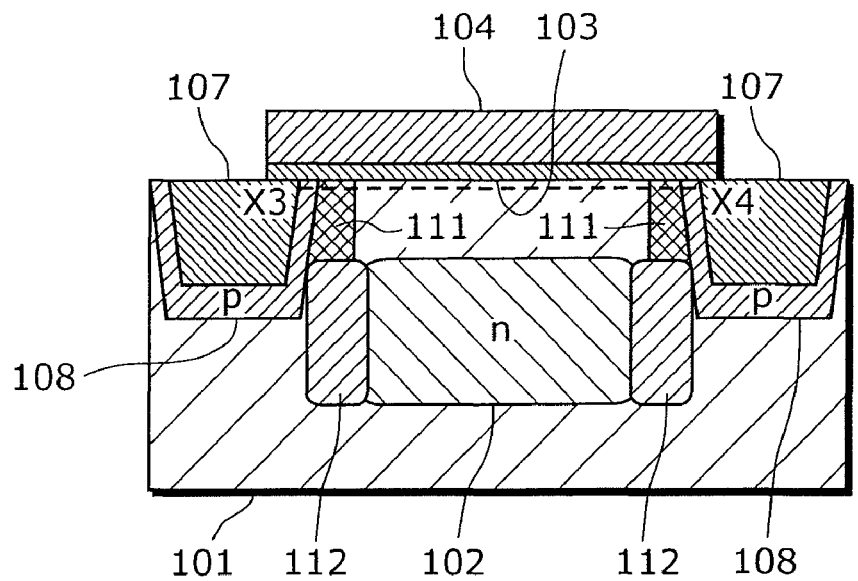
FIG. 18 is a cross sectional view, taken along the line X1-X2 of FIG. 16, which illustrates a structure of the solid-state imaging device according to the second embodiment of the present invention.

FIG. 16 to FIG. 18 are diagrams which illustrate a structure of a single pixel of the solid-state imaging device according to the second embodiment of the present invention. FIG. 16 is a top plan view illustrating a structure of a single pixel of the solid-state imaging device according to the second embodiment of the present invention. FIG. 17 is a cross sectional view, taken along the line Y3-Y4 of FIG. 16, which illustrates a structure of the solid-state imaging device. FIG. 18 is a cross sectional view, taken along the line X1-X2 of FIG. 16, which illustrates a structure of the solid-state imaging device. It is to be noted that the same numerals are assigned to the same elements as in FIG. 6 to FIG. 8, and the description that is overlapped will be omitted. Further, the read channel enlargement region 111 is not illustrated in FIG. 16 for the purpose of clarity.

Further, the cross sectional structure of the solid-state imaging device taken along the line Y1 to Y2 of FIG. 16 is the same as that in the first embodiment.

As illustrated in FIG. 16 to FIG. 18, the solid-state imaging device according to the second embodiment of the present invention has the same configuration as the solid-state imaging device according to the first embodiment and further includes a capacity enlargement region 112.

The capacity enlargement region 112 is formed to contact with the both side faces of the signal accumulation region 102 along the X direction. The capacity enlargement region 112 is the N-type region that has a higher N-type dopant concentration than that of the signal accumulation region 102, the N-type dopant concentration ranging from 4 E16/cm$^3$ to 4 E17/cm$^3$, approximately. The capacity enlargement region 112 is formed under the read channel enlargement region 111 to contact therewith.

Further, the capacity enlargement region 112 is formed to contact with the defect suppression layer 108. More specifically, the capacity enlargement region 112 is formed between the signal accumulation region 102 and the defect suppression layer 108.

With the structure described above, the solid-state imaging device according to the second embodiment of the present invention has an advantage of being capable of recovering an accumulation amount of signal charges of the signal accumulation region 102 that has been decreased due to forming the defect suppression layer 108, in addition to the same effect as those of the solid-state imaging device according to the first embodiment. This enables the solid-state imaging device according to the second embodiment of the present invention to suppress deterioration of saturation characteristic and sensitivity characteristic resulting from decrease in the area for accumulating signal charges.

Next, a method for manufacturing the solid-state imaging device according to the second embodiment will be described.

With the manufacturing method of the solid-state imaging device according to the second embodiment of the present invention, the read channel enlargement region 111 and the capacity enlargement region 112 are formed using the same ion implantation mask. It is to be noted that, other processes are the same as those in the first embodiment and description thereof will be omitted.

Figure 19:
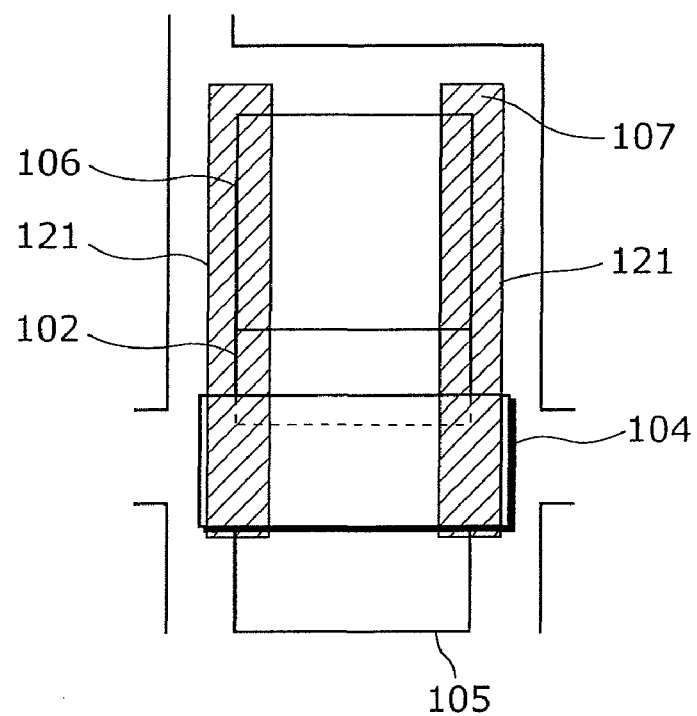
FIG. 19 is a top plan view which illustrates a structure of an ion implantation mask of the solid-state imaging device according to the second embodiment of the present invention.

FIG. 19 is a top plan view which illustrates a structure of an ion implantation mask that is used for formation of the read channel enlargement region 111 and the capacity enlargement region 112 in the manufacturing method of the solid-state imaging device according to the second embodiment of the present invention.

The read channel enlargement region 111 and the capacity enlargement region 112 can be formed with a single mask by using the ion implantation mask 121 as illustrated in FIG. 19. This makes it possible to reduce costs for manufacturing the mask and steps for mask alignment in the manufacturing process.

Further, although the ion implantation mask 121 which has an implantation space pattern only on the end of the signal accumulation region 102 and the gate electrode 104 along the X direction has been illustrated in FIG. 19, an ion implantation mask 122 as described below may be used.

Figure 20:
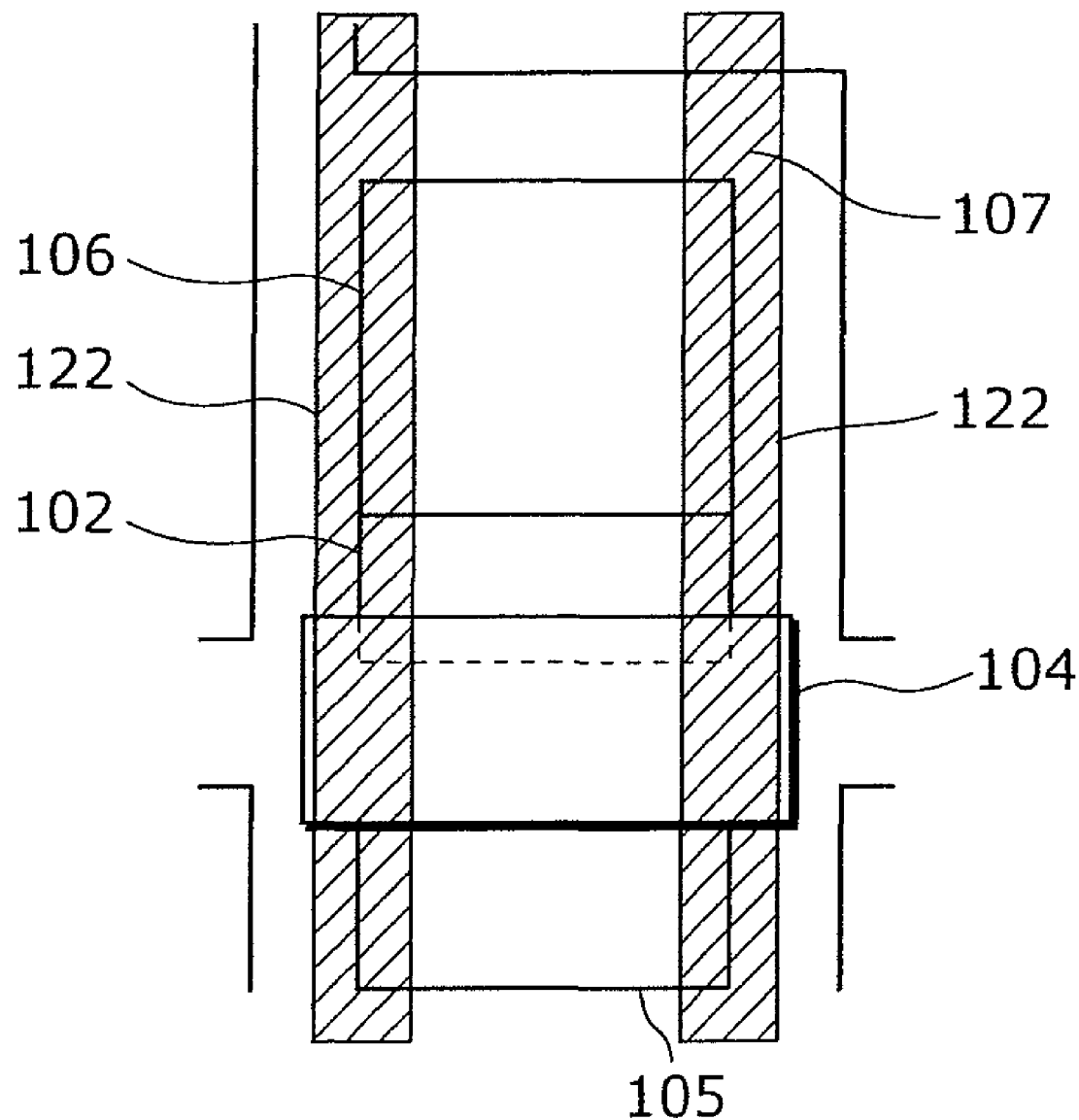
FIG. 20 is a top plan view which illustrates a structure of a modification of an ion implantation mask of the solid-state imaging device according to the second embodiment of the present invention.

FIG. 20 is a top plan view which illustrates a structure of an example of modification of the ion implantation mask used for formation of the read channel enlargement region 111 and the capacity enlargement region 112 in the manufacturing method of the solid-state imaging device according to the second embodiment of the present invention.

The implantation space pattern into which ion is implanted is formed separately in each of the pixels in the ion implantation mask 121 as illustrated in FIG. 19. On the other hand, in the ion implantation mask 122 as illustrated in FIG. 20, the implantation space pattern is formed on plural pixels sequentially in the Y direction.

FIG. 21A and FIG. 21B are top plan views which illustrate a resist pattern having 2 pixels column wise and 3 pixels row wise, formed with the ion implantation masks 121 and 122. FIG. 21A is the top plan view which illustrates the resist pattern formed with the ion implantation mask 121, and FIG. 21B is the top plan view which illustrates the resist pattern formed with the ion implantation mask 122.

It is to be noted that although 2 pixels column wise and 3 pixels row wise are illustrated for the purpose of clarity, MOS image sensors prevailing in practical use have at least 1M pixels and are used in a unit of several thousand pixels in each of row and column in many cases.

In the case where the ion implantation mask 121 is used, a resist space 131 is separately included in each of the pixels as illustrated in FIG. 21A.

On the other hand, in the case where the ion implantation mask 122 is used, a resist space 132 continues over pixels in the column (more specifically, several thousand pixels arranged lengthwise) as illustrated in FIG. 21B. This structure does not include a microscopic separated space pattern, so that the read channel enlargement region 111 and the capacity enlargement region 112 can be stably formed even in the case where the pixels are miniaturized. This enables the solid-state imaging device according to the second embodiment of the present invention to reduce unevenness in characteristics, thereby improving a fabrication yield.

It is to be noted that the resist can be improved so as to avoid curling up by refining a corner portion of the ion implantation mask 121.

Further, the capacity enlargement region 112 and the read channel enlargement region 111 may be formed by using an ion implantation mask that includes implantation space pattern that is seamless in at least two pixels in the column.

Embodiment 3

A solid-state imaging device according to a third embodiment of the present invention has the same structure as solid-state imaging device according to the second embodiment, and further includes a capacity enlargement region 112 on an end of the signal accumulation region 102 in the Y direction opposite to the side where the gate electrode 104 is formed.

Figure 22:
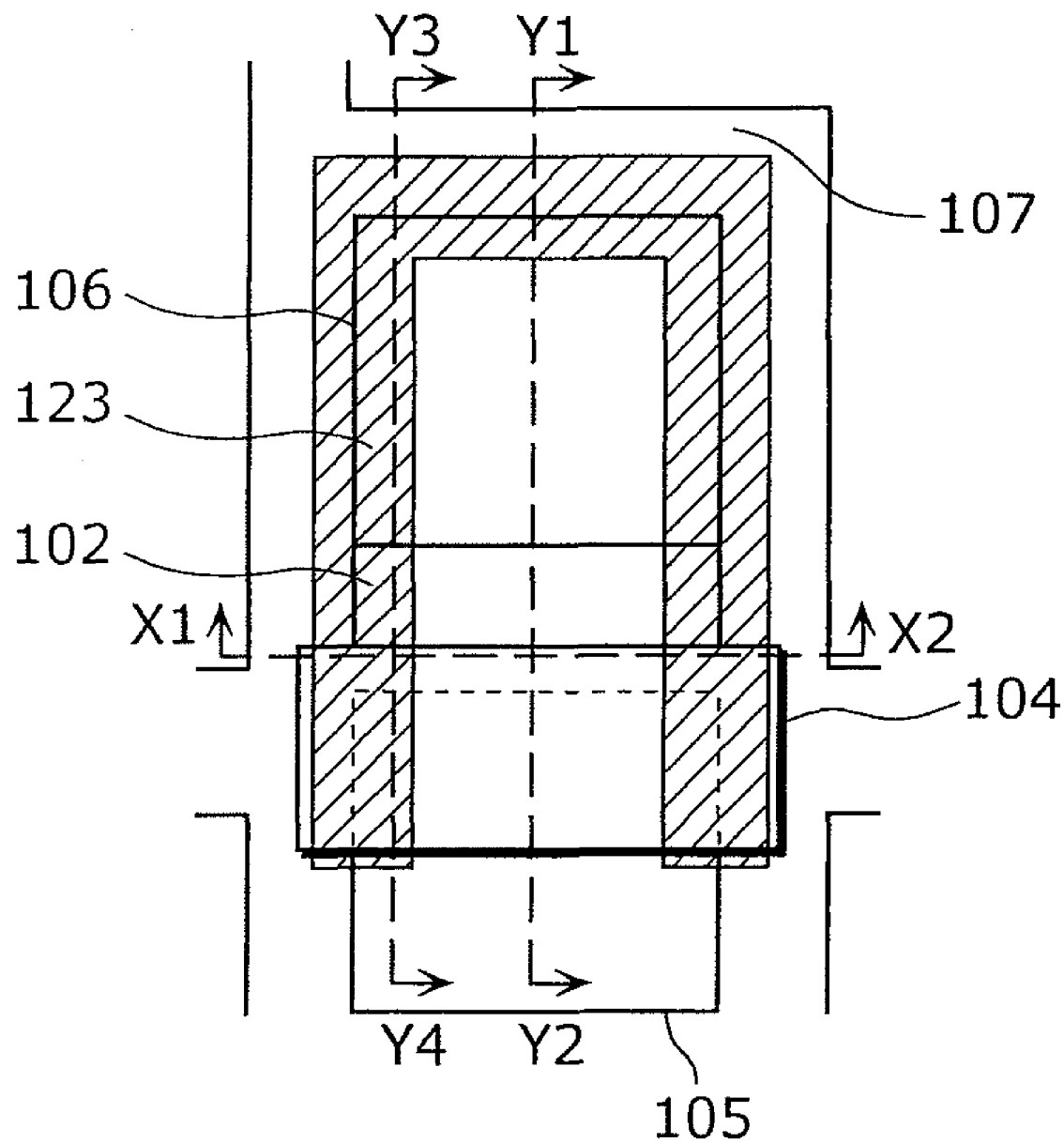
FIG. 22 is a top plan view which illustrates a structure of an ion implantation mask of a solid-state imaging device according to a third embodiment of the present invention.

FIG. 22 is a top plan view which illustrates a structure of an ion implantation mask that is used for formation of the read channel enlargement region 111 and the capacity enlargement region 112 in a manufacturing method of the solid-state imaging device according to the third embodiment of the present invention.

By using an ion implantation mask 123 illustrated in FIG. 22, the capacity enlargement region 112 is formed on the three ends, excepting the end close to the gate electrode 104, of the signal accumulation region 102 out of ends in four directions. More specifically, the capacity enlargement region 112 is formed to contact with the both side faces along the X direction, and with the side face opposite to the one close to the gate electrode 104 along the Y direction of the signal accumulation region 102.

Figure 2:
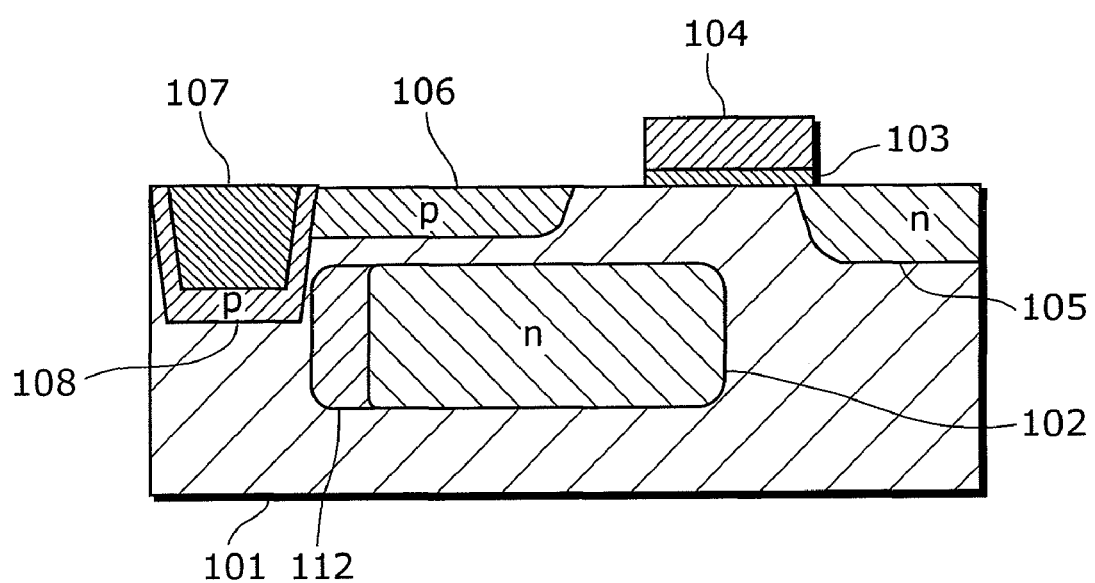
FIG. 2 is a cross sectional view, taken along the line Y1-Y2 of FIG. 1, which illustrates a structure of the conventional solid-state imaging device.

For example, the cross sectional structure taken along the line Y1-Y2 of FIG. 22 is the same as that of FIG. 2. Further, the cross sectional structures taken along the line X1-X2 and the line Y3-Y4 of FIG. 22 are the same as those of FIG. 18 and FIG. 17, respectively.

With the structure described above, the solid-state imaging device according to the third embodiment is capable of recovering a greater accumulation amount of signal charges of the signal accumulation region 102 that has been decreased due to forming the defect suppression layer 108 than the solid-state imaging device according to the second embodiment, since the area of the capacity enlargement region 112 in the third embodiment is greater than that in the second embodiment. This enables the solid-state imaging device according to the third embodiment of the present invention to further reduce deterioration of saturation characteristic and sensitivity characteristic resulting from decrease in the area for accumulating signal charges.

Figure 23:
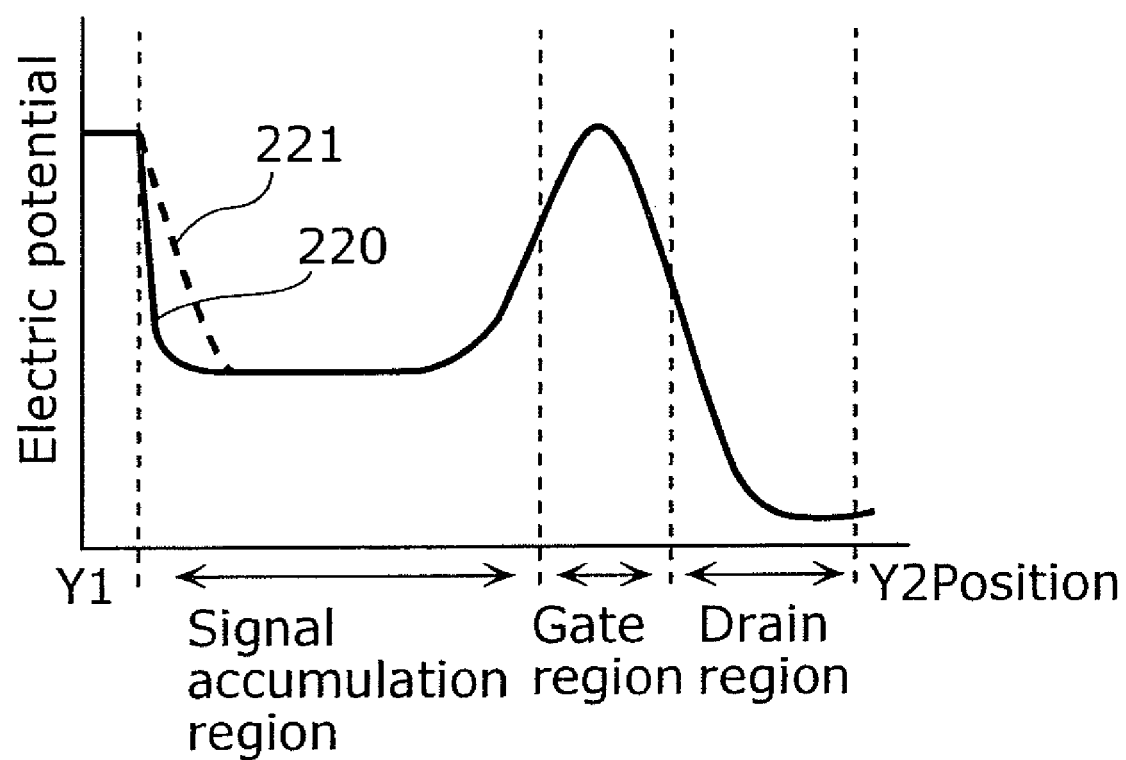
FIG. 23 is a diagram which illustrates an electric potential distribution of the solid-state imaging device when signals are accumulated according to the second and the third embodiments of the present invention.

FIG. 23 is a diagram which illustrates an electric potential distribution, when a signal is accumulated, at the positions from Y1 to Y2 of the solid-state imaging device according to the second and the third embodiments of the present invention. In FIG. 23, an electric potential 221 is the electric potential of the solid-state imaging device according to the second embodiment and an electric potential 220 is the electric potential of the solid-state imaging device according to the third embodiment.

As illustrated in FIG. 23, the electric potential 220 rises more sharply, on the side of the position Y1 of a signal accumulation region, than the electric potential 221 and a rising position of the potential becomes closer to the position Y1. With the structure described above, the solid-state imaging device according to the third embodiment is capable of accumulating more saturated electrons into the signal accumulation region 102 during the accumulation than the solid-state imaging device according to the second embodiment.

On the other hand, there is a problem that a potential pocket is more likely to occur with the solid-state imaging device according to the third embodiment than with the solid-state imaging device according to the second embodiment.

The reason for that will be described below.

Figure 24A:
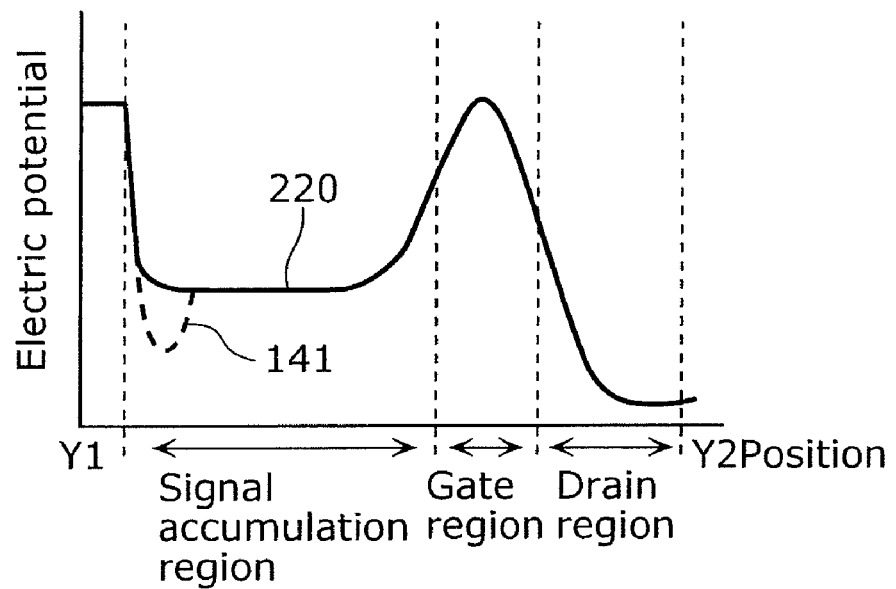
FIG. 24A is a diagram which illustrates an electric potential distribution of the solid-state imaging device according to the third embodiment of the present invention.
Figure 24B:
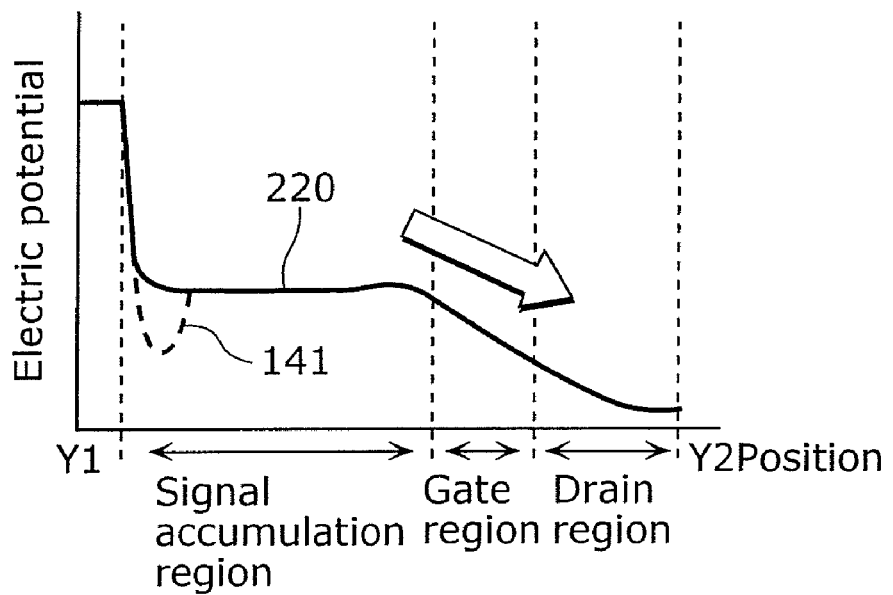
FIG. 24B is a diagram which illustrates an electric potential distribution of the solid-state imaging device according to the third embodiment of the present invention.

FIG. 24A and FIG. 24B are diagrams which illustrate an electric potential distribution at the positions from Y1 to Y2 of the solid-state imaging device according to the third embodiment. FIG. 24A is a diagram which illustrates the electric potential distribution when signal charges are accumulated in the signal accumulation region 102, and FIG. 24B is a diagram which illustrates the electric potential distribution when signals (electrons) are transferred from the signal accumulation region 102 to the drain region 105.

As illustrated in FIG. 24A, in the case where the ion implantation mask 123 is misaligned toward the Y2 direction, the capacity enlargement region 112 around Y1 becomes too large, thereby causing a potential pocket 141 in the signal accumulation region.

As illustrated in FIG. 24B, when transferring signals (electrons) from the signal accumulation region 102 to the drain region 105 by applying a positive voltage on the gate electrode 104, signals (electrons) that have accumulated in the potential pocket 141 cannot be transferred, so that the number of remaining electrons increases.

It is to be noted that in the case where improvement in accuracy of manufacturing technique reduces misalignment of the ion implantation mask 123, an increase in the number of remaining electrons caused by mask misalignment in a process of manufacturing will be reduced. This makes the solid-state imaging device according to the third embodiment more desirable state than the solid-state imaging device according to the second embodiment.

Embodiment 4

A solid-state imaging device according to a forth embodiment of the present invention has the same structure as the solid-state imaging device according to the third embodiment, and further includes a capacity enlargement region 112 on the side where the gate electrode 104 is formed in the Y direction of the signal accumulation region 102.

Figure 25:
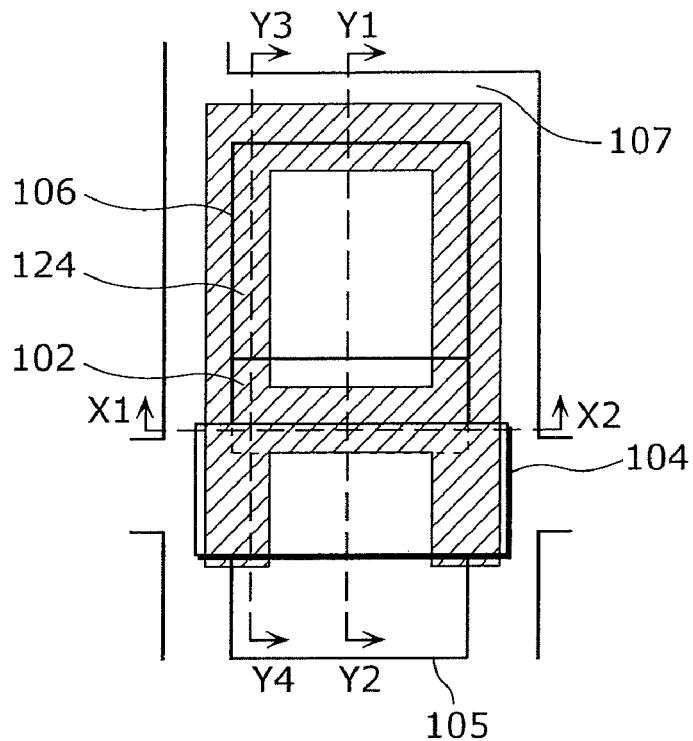
FIG. 25 is a top plan view which illustrates a structure of an ion implantation mask of a solid-state imaging device according to a forth embodiment of the present invention.

FIG. 25 is a top plan view which illustrates a structure of an ion implantation mask that is used for formation of the read channel enlargement region 111 and the capacity enlargement region 112 in a manufacturing method of the solid-state imaging device according to the forth embodiment of the present invention.

By using an ion implantation mask 124 illustrated in FIG. 25, the capacity enlargement region 112 is formed on all of the ends in the four directions of the signal accumulation region 102. More specifically, the capacity enlargement region 112 is formed to contact with the both side faces along the X direction, and with the both side faces along the Y direction of the signal accumulation region 102.

It is to be noted that, the cross sectional structures taken along the line X1-X2 and the line Y3-Y4 of FIG. 25 are the same as those of FIG. 18 and FIG. 17, respectively.

Further, the cross sectional structure taken along the line Y1-Y2 of FIG. 25 further includes the capacity enlargement region 112 on the side surface of the signal accumulation region 102 close to the gate electrode 104, in addition to the cross sectional structure as illustrated in FIG. 2.

With the structure described above, the solid-state imaging device according to the fourth embodiment is capable of recovering a greater accumulation amount of signal charges of the signal accumulation region 102 that has been decreased due to formation of the defect suppression layer 108 than the solid-state imaging device according to the third embodiment, since the area of the capacity enlargement region 112 in the fourth embodiment is greater than that in the third embodiment. This enables the solid-state imaging device according to the fourth embodiment of the present invention to further suppress deterioration of saturation characteristic and sensitivity characteristic resulting from decrease in the area for accumulating signal charges.

Figure 26:
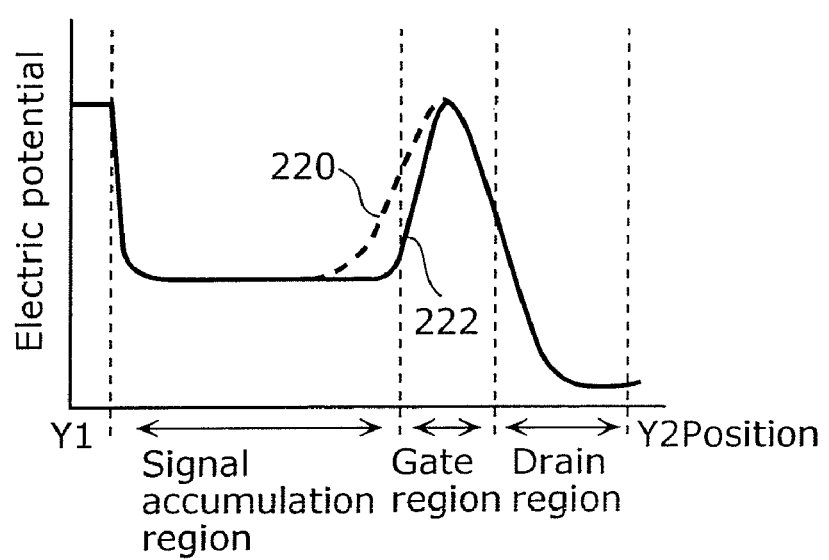
FIG. 26 is a diagram which illustrates an electric potential distribution of the solid-state imaging device when signals are accumulated according to the third and the forth embodiment of the present invention.

FIG. 26 is a diagram which illustrates an electric potential distribution, when signals are accumulated, at the positions from Y1 to Y2 of the solid-state imaging device according to the third and the fourth embodiments. In FIG. 26, an electric potential 222 is the electric potential of the solid-state imaging device according to the fourth embodiment and an electric potential 220 is the electric potential of the solid-state imaging device according to the third embodiment.

As illustrated in FIG. 26, the electric potential 222 rises more sharply, on the side of the position Y2 of a signal accumulation region, than the electric potential 220 and a rising position of the potential becomes closer to the position Y2. With the structure described above, the solid-state imaging device according to the fourth embodiment is capable of accumulating more saturated electrons into the signal accumulation region 102 during the accumulation than the solid-state imaging device according to the third embodiment.

On the other hand, there is a problem that a potential pocket is more likely to occur with the solid-state imaging device according to the fourth embodiment than with the solid-state imaging device according to the third embodiment.

The reason for that will be described below.

Figure 27A:
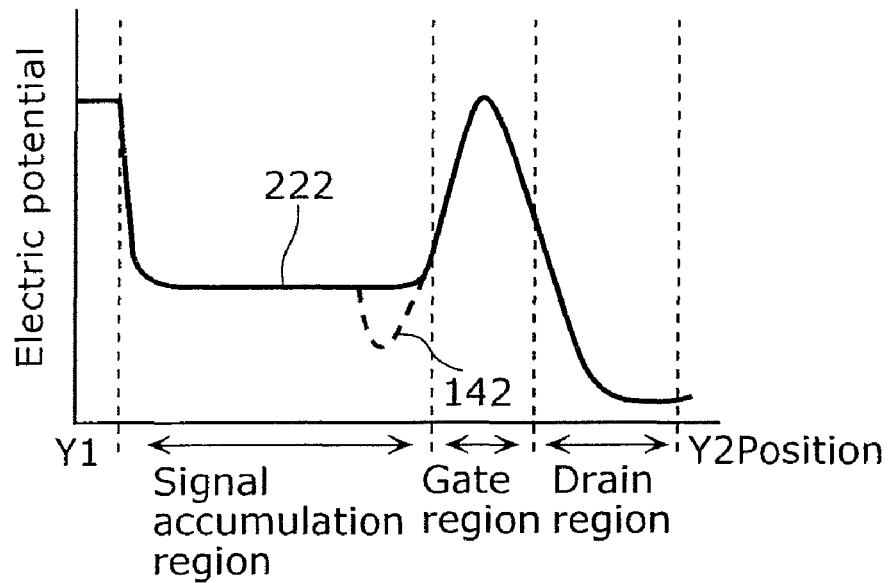
FIG. 27A is a diagram which illustrates an electric potential distribution of the solid-state imaging device according to the forth embodiment of the present invention.
Figure 27B:
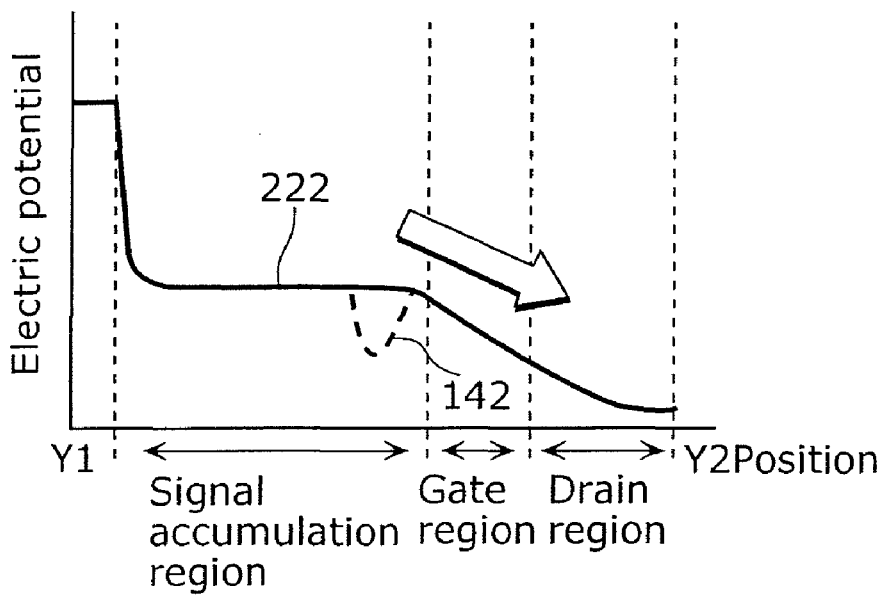
FIG. 27B is a diagram which illustrates an electric potential distribution of the solid-state imaging device according to the forth embodiment of the present invention.

FIG. 27A and FIG. 27B are diagrams which illustrate an electric potential distribution at the positions from Y1 to Y2 of the solid-state imaging device according to the fourth embodiment. FIG. 27A is a diagram which illustrates the electric potential distribution when signal charges are accumulated in the signal accumulation region 102, and FIG. 27B is a diagram which illustrates the electric potential distribution when signals (electrons) are transferred from the signal accumulation region 102 to the drain region 105.

In the case where the ion implantation mask 124 is misaligned toward the Y1 direction, the capacity enlargement region 112 around Y2 becomes too large, thereby causing a potential pocket 142 in the signal accumulation region, as illustrated in FIG. 27A.

As illustrated in FIG. 27B, when transferring signals (electrons) from the signal accumulation region 102 to the drain region 105 by applying a positive voltage on the gate electrode 104, signals (electrons) that have accumulated in the potential pocket 142 cannot be transferred, so that the number of remaining electrons increases.

Further, in the case where the ion implantation mask 124 is misaligned toward the Y2 direction, there is another problem that an area in which the N-type dopant concentration is high close to the surface is formed in large part of the portion under the gate electrode 104, thereby shortening an effective gate length. This can cause the case where signals (electrons) leak into the drain region 105 when accumulating signals in the signal accumulation region 102, thereby decreasing the number of saturated electrons adversely.

It is to be noted that in the case where improvement in accuracy of manufacturing technique reduces misalignment of the ion implantation mask 124, an increase in the number of remaining electrons caused by mask misalignment in a process of manufacturing will be reduced. This makes the solid-state imaging device according to the fourth embodiment more desirable state than the solid-state imaging device according to the third embodiment.

The solid-state imaging device according to the first to fourth embodiments has been described above, however, the present invention is not limited to these embodiments.

For example, although an example of forming pixels on the P well 101 that is formed on the semiconductor substrate (N-type semiconductor substrate) has been given in the above description, pixels may be formed directly on a P-type semiconductor substrate. In other words, a structure of each of the pixels according to the present invention described above only needs to be formed in a P-type region that is included in the semiconductor substrate.

Further, all of the P-type and the N-type in the above description may be inverted.

Further, although the read channel enlargement region 111 is formed under the both ends of the gate electrode 104 in the gate width direction in the above description, the read channel enlargement region 111 may be formed under only one end.

Further, although the capacity enlargement region 112 is formed on the both ends in the X direction of the signal accumulation region 102 according to the second embodiment in the above description, the capacity enlargement region 112 may be formed on only one end.

Further, although the capacity enlargement region 112 is formed on all of the ends of the signal accumulation region 102 according to the fourth embodiment in the above description, the capacity enlargement region 112 may be formed only on the both end in the X direction and the end close to the gate electrode 104 in the Y direction of the signal accumulation region 102.

Further, in the third and the fourth embodiments, although examples have been given in which the ion implantation mask that has a separated space pattern for each of the pixels is used, an ion implantation mask that has a space pattern continues over the column may be used similarly to FIG. 21B.

Further, in the above description, although the surface shield layer 106 and the signal accumulation region 102 (and the capacity enlargement region 112) are not in contact with each other lengthwise (in the thickness direction of the semiconductor substrate), they may be in contact with each other in the direction.

Further, in the above description, although the surface shield layer 106 is not formed in some region above the signal accumulation region 102, the surface shield layer 106 may be formed in the entire region above the signal accumulation region 102 other than the region in which the gate electrode 104 is formed.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be applied to solid-state imaging devices and, in particular to a variety of shooting devices on which a solid-state imaging device is mounted, and mobile devices provided with a shooting device typified by mobile phone devises.

What is claimed is:

1. A solid-state imaging device comprising:
a semiconductor substrate including a first region of a first conductivity type;

a signal accumulation region of a second conductivity type which converts light into a signal charge and accumulates the signal charge, said signal accumulation region provided within the first region;

a gate electrode provided above the first region;

a drain region of the second conductivity type provided on the first region on a side opposite to said signal accumulation region in relation to said gate electrode;

an isolation region having insulating properties, which is provided so as to surround a region where said signal accumulation region, said gate electrode, and said drain region are provided;

a first conductivity type dopant doping region provided in contact with a side face and a bottom face of said isolation region, said first conductivity type dopant doping region having a higher dopant concentration than the first region; and a second conductivity type dopant doping region provided within the first region, under an end of said gate electrode in a gate width direction and not under a center of said gate electrode in the gate width direction.

2. The solid-state imaging device according to claim 1, wherein said first conductivity type dopant doping region is a defect suppression region and said second conductivity type dopant doping region is a channel enlargement region.

3. The solid-state imaging device according to claim 1, wherein said second conductivity type dopant doping region has a first conductivity type dopant concentration which is higher than a second conductivity type dopant concentration of said second conductivity type dopant doping region.

4. The solid-state imaging device according to claim 1, wherein at least a portion of said first conductivity type dopant doping region is provided under said gate electrode, and said second conductivity type dopant doping region is in contact with said first conductivity type dopant doping region.

5. The solid-state imaging device according to claim 1, wherein said second conductivity type dopant doping region is provided within the first region, under both ends of said gate electrode in the gate width direction.

6. The solid-state imaging device according to claim 1, further comprising:

a capacity enlargement region of the second conductivity type provided in contact with a side face of said signal accumulation region in the gate width direction, said capacity enlargement region having a higher second conductivity type dopant concentration than said signal accumulation region.

7. The solid-state imaging device according to claim 1, further comprising:

a surface shield layer of the first conductivity type provided within the first region above said signal accumulation region, said surface shield layer having a higher first conductivity type dopant concentration than the first region.

8. A method of manufacturing a solid-state imaging device, said method comprising:

providing a first region of a first conductivity type within a semiconductor substrate;

providing a signal accumulation region of a second conductivity type within the first region, the signal accumulation region converting light into a signal charge and accumulating the signal charge;

providing a gate electrode above the first region;

providing a drain region of the second conductivity type on the first region on a side opposite to the signal accumulation region in relation to the gate electrode;

providing an isolation region having insulating properties so as to surround a region where the signal accumulation region, the gate electrode, and the drain region are provided;

providing a first conductivity type dopant doping region in contact with a side face and a bottom face of the isolation region, the first conductivity type dopant doping region having a higher dopant concentration than the first region; and providing a second conductivity type dopant doping region within the first region, under an end of the gate electrode in a gate width direction and not under a center of said gate electrode in the gate width direction.

9. The method of manufacturing a solid-state imaging device according to claim 8, further comprising:

forming a surface shield layer of the first conductivity type within the first region above the signal accumulation region, the surface shield layer having a higher first conductivity type dopant concentration than the first region.

10. The method of manufacturing a solid-state imaging device according to claim 8, further comprising:

providing a capacity enlargement region of the second conductivity type in contact with a side face of the signal accumulation region in the gate width direction by using an ion implantation mask that is used for forming the second conductivity type dopant doping region, the capacity enlargement region having a higher second conductivity type dopant concentration than the signal accumulation region.

11. The method of manufacturing a solid-state imaging device according to claim 10, wherein the signal accumulation region, the gate electrode, the drain region, the second conductivity type dopant doping region, and the capacity enlargement region are provided in each pixel of the solid-state imaging device, and the capacity enlargement region and the second conductivity type dopant doping region are provided by using the ion implantation mask having an implantation space pattern that covers at least two pixels.

* * * * *